United States Patent
Yoneda et al.

(10) Patent No.: US 10,249,848 B2
(45) Date of Patent: Apr. 2, 2019

(54) ORGANIC LIGHT-EMITTING PANEL AND METHOD FOR PRODUCING SAME

(75) Inventors: Kazuhiro Yoneda, Osaka (JP); Keiko Kurata, Hyogo (JP); Noriyuki Matsusue, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/241,128

(22) PCT Filed: Jul. 17, 2012

(86) PCT No.: PCT/JP2012/004570
§ 371 (c)(1),
(2), (4) Date: Feb. 26, 2014

(87) PCT Pub. No.: WO2013/065213
PCT Pub. Date: May 10, 2013

(65) Prior Publication Data
US 2014/0203271 A1    Jul. 24, 2014

(30) Foreign Application Priority Data
Nov. 2, 2011 (JP) .................................. 2011-241497

(51) Int. Cl.
*H01L 51/52* (2006.01)
*H01L 51/56* (2006.01)
*H01L 27/32* (2006.01)

(52) U.S. Cl.
CPC ...... *H01L 51/5275* (2013.01); *H01L 27/3211* (2013.01); *H01L 51/5265* (2013.01); *H01L 51/56* (2013.01)

(58) Field of Classification Search
CPC ... H01L 51/5275; H01L 27/3211; H01L 51/56
(Continued)

(56) References Cited

U.S. PATENT DOCUMENTS

| 5,443,922 A | 8/1995 | Nishizaki et al. |
| 8,680,542 B2 | 3/2014 | Kurata et al. |

(Continued)

FOREIGN PATENT DOCUMENTS

| JP | 05-163488 | 6/1993 |
| JP | 2004-134158 | 4/2004 |

(Continued)

OTHER PUBLICATIONS

International Search Report (ISR) in International Patent Application No. PCT/JP2012/004570, dated Sep. 18, 2012.

*Primary Examiner* — Sheng-Bai Zhu
(74) *Attorney, Agent, or Firm* — Greenblum & Bernstein, P.L.C.

(57) ABSTRACT

An organic light-emitting panel includes a reflective electrode, a functional layer, having a single or multi-layer structure, located on the reflective electrode, an organic light-emitting layer located on the functional layer, a transparent electrode located above the organic light-emitting layer, a low refractive index layer located on the transparent electrode, and a first thin-film sealing layer located on the low refractive index layer. The low refractive index layer has a lower refractive index than both the transparent electrode and the first thin-film sealing layer. Difference between respective refractive indices of the low refractive index layer and the transparent electrode is 0.4-1.1. Difference between respective refractive indices of the low refractive index layer and the first thin-film sealing layer is 0.1-0.8. The low refractive index layer has thickness of 20-130 nm.

15 Claims, 19 Drawing Sheets

(58) Field of Classification Search
USPC .............. 257/40, 88, 98, E51.018, E27.119; 438/29
See application file for complete search history.

(56) References Cited

U.S. PATENT DOCUMENTS

| | | | |
|---|---|---|---|
| 2005/0051791 A1* | 3/2005 | Gotoh | H01L 51/5262 257/99 |
| 2006/0113617 A1* | 6/2006 | Kawamura | H01L 27/322 257/414 |
| 2007/0069996 A1* | 3/2007 | Kuba | H01L 51/5265 345/76 |
| 2008/0049431 A1* | 2/2008 | Boek et al. | 362/311 |
| 2008/0258609 A1* | 10/2008 | Nakamura | 313/504 |
| 2008/0265245 A1 | 10/2008 | Gotoh et al. | |
| 2009/0256168 A1* | 10/2009 | Taneda et al. | 257/98 |
| 2009/0302750 A1* | 12/2009 | Jun et al. | 313/504 |
| 2010/0110551 A1* | 5/2010 | Lamansky | G02B 5/021 359/599 |
| 2012/0234460 A1* | 9/2012 | Zhang et al. | 156/67 |

FOREIGN PATENT DOCUMENTS

| | | |
|---|---|---|
| JP | 2004-335183 | 11/2004 |
| JP | 2004-361662 | 12/2004 |
| JP | 2005-085710 | 3/2005 |
| JP | 2006-107837 | 4/2006 |
| JP | 2007-294266 | 11/2007 |
| JP | 2008-218081 | 9/2008 |
| JP | 2009-295581 | 12/2009 |
| JP | 2011-210677 | 10/2011 |

* cited by examiner

| Cavity | NaF (nm) | Efficiency (cd/A) | | |
|---|---|---|---|---|
| | | Red | Green | Blue |
| 1st | 85 | 3.7 | 40.9 | 2.3 |
| 1st | 0 | 6.4 | 37.1 | 1.1 |
| 1.5 | 0 | 3.0 | 36.2 | 1.5 |

FIG. 7A

|  | Refractive index (n) | | | Film thickness (nm) | |
| --- | --- | --- | --- | --- | --- |
|  | Min. | Ave. | Max. | Min. | Max. |
| Resin sealing layer | 1.3 | 1.5 | 1.7 | 1000 | 10000 |
| Thin-film sealing layer | 1.7 | 1.9 | 2.1 | 100 | 680 |
| Low refractive index layer | 1.3 | 1.45 | 1.6 | 50 | 100 |
| Transparent electrode | 2.0 | 2.2 | 2.4 | 30 | 40 |
| Electron transport layer | 1.7 | 1.9 | 2.1 | 30 | 40 |
| Organic light-emitting layer | 1.6 | 1.8 | 2.0 | 40 | 60 |
| Hole transport layer | 1.5 | 1.7 | 1.9 | 7 | 23 |
| Hole injection layer | 1.8 | 2.0 | 2.2 | 3 | 7 |
| Transparent conductive layer | 1.9 | 2.1 | 2.3 | 14 | 18 |
| Reflective electrode | 0.12 | 1.4 | 0.19 | 180 | 220 |

FIG. 7B

|  | Optical path length (nm) | |
| --- | --- | --- |
|  | Min. | Max. |
| Resin sealing layer | 1300 | 17000 |
| Thin-film sealing layer | 170 | 1428 |
| Low refractive index layer | 65 | 160 |
| Transparent electrode | 60 | 96 |
| Electron transport layer | 51 | 84 |
| Organic light-emitting layer | 64 | 120 |
| Hole transport layer | 10.5 | 43.7 |
| Hole injection layer | 5.4 | 15.4 |
| Transparent conductive layer | 26.6 | 41.4 |
| Reflective electrode | 21.6 | 41.8 |

|  | Refractive index (n) @ 460 nm | Film thickness (nm) |
|---|---|---|
| Substrate | 1.53 | 500000 |
| Resin sealing layer | 1.52 | 6000 |
| Thin-film sealing layer | 1.90 | 620 |
| Low refractive index layer | 1.0-2.0 | 0-500 |
| Transparent electrode | 2.21 | 35 |

Blue light-extraction efficiency improvement ratio

ORGANIC LIGHT-EMITTING PANEL AND METHOD FOR PRODUCING SAME

TECHNICAL FIELD

The present invention relates to an organic light-emitting panel that utilizes electroluminescence of an organic material, and to a method for producing the organic light-emitting panel. In particular, the present invention relates to an art of optical design.

BACKGROUND ART

In recent years, an organic light-emitting panel, which utilizes electroluminescence of an organic material, has been proposed for use as a display panel in a display device such as a digital television. An organic light-emitting panel typically includes organic light-emitting elements of red (R), green (G), and blue (B) colors arranged in a matrix. The organic light-emitting elements, which are each of one of the aforementioned colors, each include a reflective electrode, a transparent electrode arranged in opposition to the reflective electrode, and an organic light-emitting layer of a corresponding color located between the reflective electrode and the transparent electrode.

In the field of organic light-emitting panels, various arts are known for improving light-extraction efficiency (ratio of output luminance to input electrical power) of an organic light-emitting element through optical design. In particular, Patent Literature 1-3 each propose an art for improving light-extraction efficiency of an organic light-emitting element by providing an optical adjustment layer at a light-extraction side of the organic light-emitting element.

For example, Patent Literature 1 discloses an organic electroluminescence (EL) element array including a reflective electrode, an organic compound layer, a transparent electrode, an optical path length adjustment layer, and a transparent layer. In Patent Literature 1 a microresonator structure is configured by an interface between the reflective electrode and the organic compound layer, and by an interface between the optical path length adjustment layer and the transparent layer, through setting a difference between respective refractive indices of the optical path length adjustment layer and the transparent layer as greater than a difference between respective refractive indices of the optical path length adjustment layer and the transparent electrode (refer to paragraphs 0014 and 0027, and claim 1).

Patent Literature 2 discloses an organic EL element including a metal electrode, an EL layer, a transparent electrode, a high refractive index layer, a low refractive index layer, and a transparent base, wherein a refractive index of the high refractive index layer is set as greater than "refractive index of the transparent electrode minus 0.2" (refer to paragraphs 0013, and 0020-0023).

Patent Literature 3 discloses an organic EL element including a cathode, an electron transport layer, an organic light-emitting layer, a hole transport layer, an anode, an intermediate layer, and a transparent base, wherein a refractive index of the inter mediate layer is set as an intermediate value between a refractive index of the anode and a refractive index of the transparent base (refer to paragraphs 0021 and 0022).

CITATION LIST

Patent Literature

[Patent Literature 1] Japanese Patent Application Publication No. 2008-218081

[Patent Literature 2] Japanese Patent Application Publication No. 2007-294266

[Patent Literature 3] Japanese Patent Application Publication No. 2004-134158

SUMMARY OF INVENTION

Technical Problem

Unfortunately, even if the arts described above are adopted in an organic light-emitting element, light-extraction efficiency of the organic light-emitting element is still insufficient. In consideration of the above problem, the present invention aims to provide an organic light-emitting panel in which light-extraction efficiency of an organic light-emitting element is improved by adopting a structure in which an optical adjustment layer is provided at a light-extraction side of the organic light-emitting element.

Solution to Problem

An organic light-emitting panel relating to one aspect of the present invention comprises: a first electrode that is light-reflecting; a functional layer having a single layer or multi-layer structure, located on the first electrode; an organic light-emitting layer located on the functional layer; a second electrode that is light-transmitting, located above the organic light-emitting layer; a first layer located on the second electrode; and a second layer located on the first layer, wherein a refractive index of the first layer is lower than a refractive index of the second electrode, and a difference between the refractive index of the first layer and the refractive index of the second electrode is at least 0.4 and no greater than 1.1, the refractive index of the first layer is lower than a refractive index of the second layer, and a difference between the refractive index of the first layer and the refractive index of the second layer is at least 0.1 and no greater than 0.8, and the first layer has thickness of at least 20 nm and no greater than 130 nm.

Advantageous Effects of Invention

Through the above configuration, the first layer is provided as an optical adjustment layer at a light-extraction side of an organic light-emitting element. Light-extraction efficiency of the organic light-emitting element can be improved when the conditions described above are satisfied with respect to the thickness of the first layer, the difference between the refractive index of the first layer and the refractive index of the second electrode, and the difference between the refractive index of the first layer and the refractive index of the second layer.

BRIEF DESCRIPTION OF DRAWINGS

FIG. 7A is a table illustrating appropriate ranges for refractive index and film thickness of each layer, and FIG. 7B is a table illustrating an appropriate range for optical path length of each layer.

DESCRIPTION OF EMBODIMENTS

Outline of One Aspect of Invention

Figure 1:
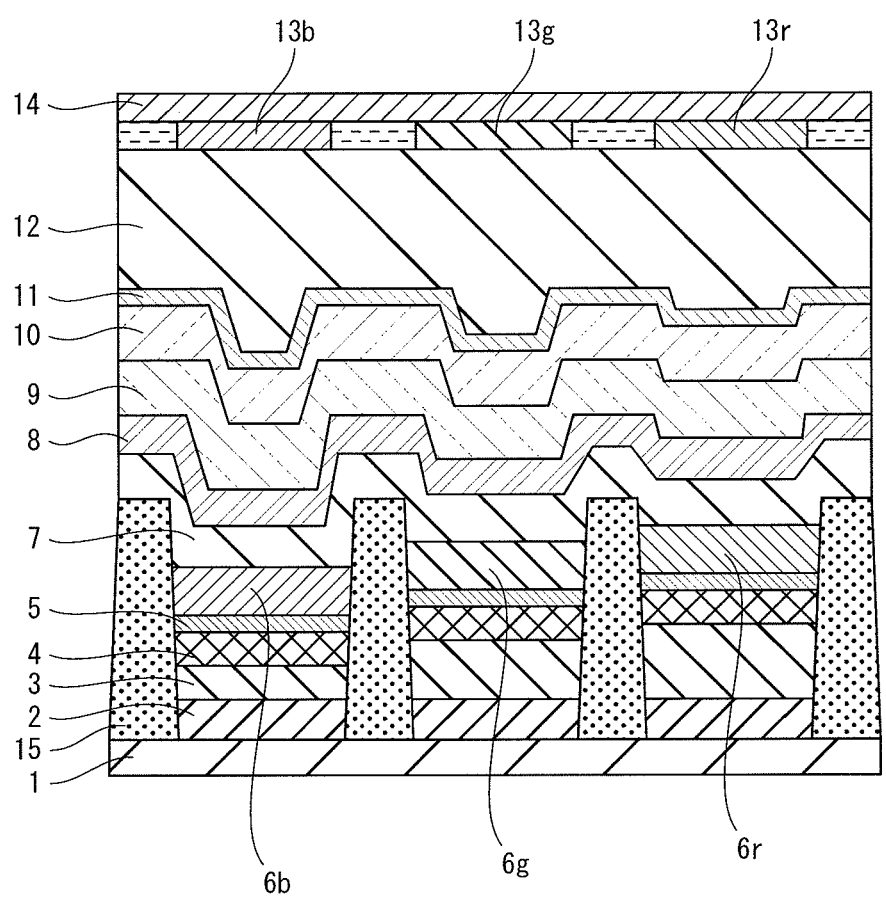
FIG. 1 is a cross-sectional diagram schematically illustrating pixel structure of an organic light-emitting panel relating to an embodiment of the present invention.

An organic light-emitting panel relating to one aspect of the present invention comprises: a first electrode that is light-reflecting; a functional layer having a single layer or multi-layer structure, located on the first electrode; an organic light-emitting layer located on the functional layer; a second electrode that is light-transmitting, located above the organic light-emitting layer; a first layer located on the second electrode; and a second layer located on the first layer, wherein a refractive index of the first layer is lower than a refractive index of the second electrode, and a difference between the refractive index of the first layer and the refractive index of the second electrode is at least 0.4 and no greater than 1.1, the refractive index of the first layer is lower than a refractive index of the second layer, and a difference between the refractive index of the first layer and the refractive index of the second layer is at least 0.1 and no greater than 0.8, and the first layer has thickness of at least 20 nm and no greater than 130 nm.

Alternatively, the first layer may have thickness of at least 50 nm and no greater than 110 nm.

Alternatively, the first layer may include metal fluoride and have thickness of at least 75 nm and no greater than 120 nm.

Alternatively, the first layer may have thickness of at least 50 nm and no greater than 100 nm.

Alternatively, the functional layer may have thickness no greater than 80 nm.

Alternatively, the functional layer may have thickness no greater than 70 nm.

Alternatively, the refractive index of the second electrode may be at least 2.0 and no greater than 2.4, the refractive index of the first layer may be at least 1.3 and no greater than 1.6, and the refractive index of the second layer may be at least 1.7 and no greater than 2.1.

Alternatively, the second electrode may have thickness of at least 30 nm and no greater than 40 nm, and the second layer may have thickness of at least 100 nm and no greater than 680 nm.

Alternatively, the second electrode may include ITO or IZO, the first layer may include metal fluoride, silicon oxide or silicon oxynitride, and the second layer may include silicon nitride or silicon oxynitride.

Alternatively, the organic light-emitting panel relating to one aspect of the present invention may further comprise a color filter located above the second layer.

Alternatively, the organic light-emitting layer may be composed of light emitting layer portions of red (R), green (G), and blue (B) colors, and regions of the first layer corresponding to the R, G and B colors may be equal in terms of thickness.

An organic light-emitting panel relating to another aspect of the present invention comprises: a first electrode that is light-reflecting; a functional layer having a single layer or multi-layer structure, located on the first electrode; an organic light-emitting layer located on the functional layer; a second electrode that is light-transmitting, located above the organic light-emitting layer; a first layer located on the second electrode; and a second layer located on the first layer, wherein a refractive index of the first layer is lower than a refractive index of the second electrode, and a difference between the refractive index of the first layer and the refractive index of the second electrode is at least 0.4 and no greater than 1.1, the refractive index of the first layer is lower than a refractive index of the second layer, and a difference between the refractive index of the first layer and the refractive index of the second layer is at least 0.1 and no greater than 0.8, and an optical path length in a thickness direction of the first layer is at least 26 nm and no greater than 208 nm.

Alternatively, the optical path length in the thickness direction of the first layer may be at least 65 nm and no greater than 176 nm.

Alternatively, the first layer may include metal fluoride and the optical path length in the thickness direction of the first layer may be at least 99.8 nm and no greater than 160 nm.

Alternatively, the optical path length in the thickness direction of the first layer may be at least 65 nm and no greater than 160 nm.

Alternatively, an optical path length in a thickness direction of the functional layer may be no greater than 184 nm.

Alternatively, an optical path length in a thickness direction of the functional layer may be no greater than 161 nm.

Alternatively, the refractive index of the second electrode may be at least 2.0 and no greater than 2.4, the refractive index of the first layer may be at least 1.3 and no greater than 1.6, and the refractive index of the second layer may be at least 1.7 and no greater than 2.1.

Alternatively, an optical path length in a thickness direction of the second electrode may be at least 60 nm and no greater than 96 nm, and an optical path length in a thickness direction of the second layer may be at least 170 nm and no greater than 1428 nm.

Alternatively, the second electrode may include ITO or IZO, the first layer may include metal fluoride, silicon oxide or silicon oxynitride, and the second layer may include silicon nitride or silicon oxynitride.

Alternatively, the organic light-emitting panel relating to the other aspect of the present invention may further comprise a color filter located above the second layer.

Alternatively, the organic light-emitting layer may be composed of light emitting layer portions of red (R), green (G), and blue (B) colors, and regions of the first layer corresponding to the R, G and B colors may be equal in terms of thickness.

A method for producing an organic light-emitting panel relating to one aspect of the present invention comprises: forming a first electrode that is light-reflecting; layering a functional layer having a single layer or multi-layer structure on the first electrode; layering an organic light-emitting layer on the functional layer; forming a second electrode that is light-transmitting above the organic light-emitting layer; layering a first layer on the second electrode; and layering a second layer on the first layer, wherein a refractive index of the first layer is lower than a refractive index of the second electrode, and a difference between the refractive index of the first layer and the refractive index of the second electrode is at least 0.4 and no greater than 1.1, the refractive index of the first layer is lower than a refractive index of the second layer, and a difference between the refractive index of the first layer and the refractive index of the second layer is at least 0.1 and no greater than 0.8, and the first layer has thickness of at least 20 nm and no greater than 130 nm.

A method for producing an organic light-emitting panel relating to another aspect of the present invention comprises: forming a first electrode that is light-reflecting; layering a functional layer having a single layer or multi-layer structure on the first electrode; layering an organic light-emitting layer on the functional layer; forming a second electrode that is light-transmitting above the organic light-emitting layer; layering a first layer on the second electrode; and layering a second layer on the first layer, wherein a refractive index of the first layer is lower than a refractive index of the second electrode, and a difference between the refractive index of the first layer and the refractive index of the second electrode is at least 0.4 and no greater than 1.1, the refractive index of the first layer is lower than a refractive index of the second layer, and a difference between the refractive index of the first layer and the refractive index of the second layer is at least 0.1 and no greater than 0.8, and an optical path length in a thickness direction of the first layer is at least 26 nm and no greater than 208 nm.

Embodiment

The following explains an embodiment of the present invention in detail, with reference to the drawings.

[Organic Light-Emitting Panel Pixel Structure]

FIG. 1 is a cross-sectional diagram schematically illustrating pixel structure of an organic light-emitting panel relating to the embodiment of the present invention.

The organic light-emitting panel includes a substrate 1, a reflective electrode 2, a transparent conductive layer 3, a hole injection layer 4, a hole transport layer 5, organic light-emitting layer portions 6b, 6g and 6r, an electron transport layer 7, a transparent electrode 8, a low refractive index layer 9, a first thin-film sealing layer 10, a second thin-film sealing layer 11, a resin sealing layer 12, color filters 13b, 13g and 13r, a substrate 14, and banks 15. A layered structure including layers from the reflective electrode 2 through to the transparent electrode 8 configures a plurality of organic light-emitting elements. In the present example, the substrate 1, the electron transport layer 7, the transparent electrode 8, the low refractive index layer 9, the first thin-film sealing layer 10, the second thin-film sealing layer 11, the resin sealing layer 12, and the substrate 14 are common to the organic light-emitting elements of each of R, G and B colors. The above-listed layers have the same thicknesses for each of the R, G and B colors. The reflective electrode 2, the transparent conductive layer 3, the hole injection layer 4, the hole transport layer 5, and a light-emitting layer composed of the light-emitting layer portions 6b, 6g and 6r are partitioned for each of the organic light-emitting elements by the banks 15.

Figure 2A:
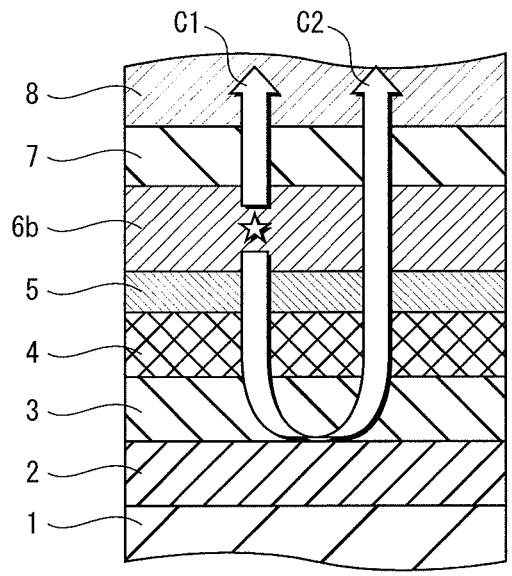
FIG. 2A illustrates an example of resonator structure within a blue organic light-emitting element.

Resonator structures which use a phenomenon of light interference are implemented in the organic light-emitting panel. FIG. 2A illustrates an example of a resonator structure present within a blue organic light-emitting element. In the blue organic light-emitting element, one portion of light emitted from the organic light-emitting layer portion 6b travels toward the transparent electrode 8 without travelling toward the reflective electrode 2, and thus is emitted externally from the blue organic light-emitting element via the transparent electrode 8, along a first optical pathway C1. A remaining portion of light emitted from the organic light-emitting layer portion 6b travels toward the reflective electrode 2, is reflected by the reflective electrode 2, and thus is emitted externally from the blue organic light-emitting element via the organic light-emitting layer portion 6b and the transparent electrode 8, along a second optical pathway C2.

A phenomenon of interference of light travelling along the first optical pathway C1 and light travelling along the second optical pathway C2 can be achieved by appropriately adjusting thickness of a functional layer located between the reflective electrode 2 and the organic light-emitting layer portion 6b (i.e., a layer composed of the transparent conductive layer 3, the hole injection layer 4, and the hole transport layer 5 in the present embodiment). The phenomenon of light interference enables improvement of light-extraction efficiency.

Figure 2B:
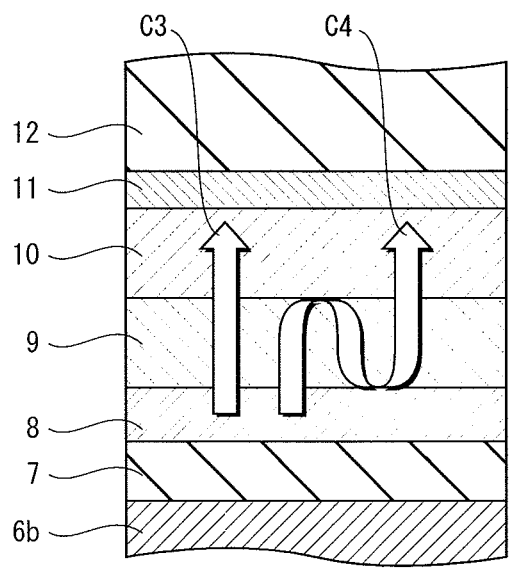
FIG. 2B illustrates an example of resonator structure externally to the organic light-emitting element.

FIG. 2B illustrates an example of a resonator structure which is present externally to the blue organic light-emitting element. In the present embodiment, the low refractive index layer 9 is an optical adjustment layer which is located between the transparent electrode 8 and the first thin-film sealing layer 10. The low refractive index layer 9 has a lower refractive index than both the transparent electrode 8 and the first thin-film sealing layer 10. Through the above configuration, one portion of light emitted from the blue organic light-emitting element travels through the low refractive index layer 9 without being reflected, along a first optical pathway C3. The remaining portion of light emitted from the blue organic light-emitting element undergoes multi-reflection at an interface between the transparent electrode 8 and the low refractive index layer 9, and at an interface between the low refractive index layer 9 and the first thin-film sealing layer 10, and thus travels through the low refractive index layer 9 along a fourth optical pathway C4. A phenomenon of interference of light travelling along the third optical pathway C3 and light travelling along the fourth optical pathway C4 can be achieved by appropriately setting film thickness of the low refractive index layer 9, a difference between respective refractive indices of the transparent electrode 8 and the low refractive index layer 9, and a difference between respective refractive indices of the low refractive index layer 9 and the first thin-film sealing layer 10. The phenomenon of light interference enables improvement of light-extraction efficiency.

Figure 2C:
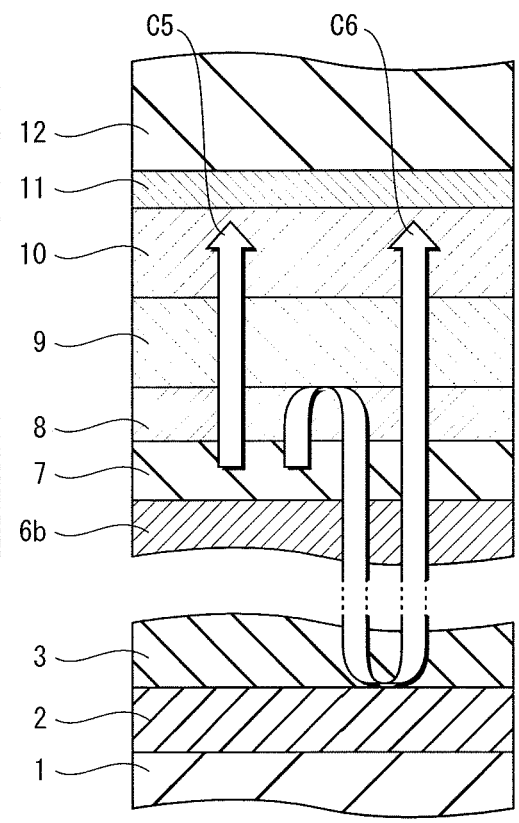
FIG. 2C illustrates an example of a different resonator structure within the organic light-emitting element.

Research by the inventors lead to a discovery that a resonator structure illustrated in FIG. 2C is also present. In the present embodiment, the low refractive index layer 9 is located on the transparent electrode 8. Through the above configuration, light travelling along a fifth optical pathway C5 is not reflected at the interface between the transparent electrode 8 and the low refractive index layer 9, and light travelling along a sixth optical pathway C6 undergoes multi-reflection at the interface between the transparent electrode 8 and the low refractive index layer 9, and at an interface between the reflective electrode 2 and the transparent conductive layer 3.

Figure 3:
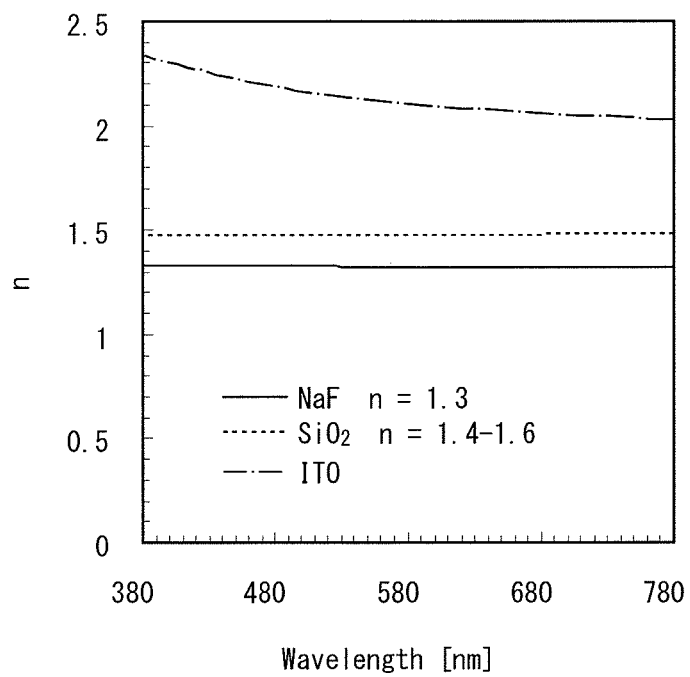
FIG. 3 illustrates wavelength dependence of respective refractive indices of sodium fluoride, silicon oxide, and indium tin oxide (ITO).

In the present embodiment, conditions (a) to (f) shown below are satisfied. In the conditions (a) to (f), $n_a$ represents a refractive index of the transparent electrode 8, $n_b$ represents a refractive index of the low refractive index layer 9, $n_c$ represents a refractive index of the first thin-film sealing layer 10, $\Delta n_{ab}$ represents a difference between respective refractive indices of the transparent electrode 8 and the low refractive index layer 9, $\Delta n_{bc}$ represents a difference between respective refractive indices of the low refractive index layer 9 and the first thin-film sealing layer 10, and $d_b$ represents film thickness of the low refractive index layer 9. As illustrated in FIG. 3, respective refractive indices of sodium fluoride (NaF) and silicon oxide ($SiO_x$) each have low wavelength dependence in a visible light region. In comparison to the refractive indices of NaF and $SiO_x$, a refractive index of ITO has relatively high wavelength dependence in the visible light region. In the present Description, refractive indices are explained for light of wavelength 600 nm unless otherwise stated.

$2.0 \leq n_a \leq 2.4$ (a)

$1.3 \leq n_b \leq 1.6$ (b)

$1.7 \leq n_c \leq 2.1$ (c)

$0.4 \leq \Delta n_{ab} \leq 1.1$ (d)

$0.1 \leq \Delta n_{bc} \leq 0.8$ (e)

$20 \text{ nm} \leq d_b \leq 130 \text{ nm}$ (f)

[Simulations]

The following explains simulations that were conducted by the inventors. Note that among R, G and B colors, demand for improved light-extraction efficiency has been particularly strong for blue up to the present date. Therefore, the simulations focused on improving light-extraction efficiency of a blue organic light-emitting element.

<1> Low Refractive Index Layer Film Thickness

<1-1> First simulation

In a first simulation, refractive index of each layer was set as shown below in consideration of material used to make the layer.

The reflective electrode 2 had a refractive index $n_2=0.14$.

The transparent conductive layer 3 had a refractive index $n_3=2.1$.

The hole injection layer 4 had a refractive index $n_4=2.0$.

The hole transport layer 5 had a refractive index $n_5=1.7$.

The organic light-emitting layer portions 6b, 6g and 6r had a refractive index $n_6=1.8$.

The electron transport layer 7 had a refractive index $n_7=1.9$.

The resin sealing layer 12 had a refractive index $n_{12}=1.5$.

The substrate 14 had a refractive index $n_{14}=1.5$.

Also, respective refractive indices of the transparent electrode 8, the low refractive index layer 9, and the first thin-film sealing layer 10 were provisionally set as shown below, assuming that the transparent electrode 8 is made of ITO, the low refractive index layer 9 is made of sodium fluoride, and the first thin-film sealing layer 10 is made of silicon nitride. The aforementioned refractive indices can be appropriately adjusted by adjusting film formation conditions.

The transparent electrode 8 had a refractive index $n_a=2.0$.

The low refractive index layer 9 had a refractive index $n_b=1.3$.

The first thin-film sealing layer 10 had a refractive index $n_c=1.9$.

Figure 4:
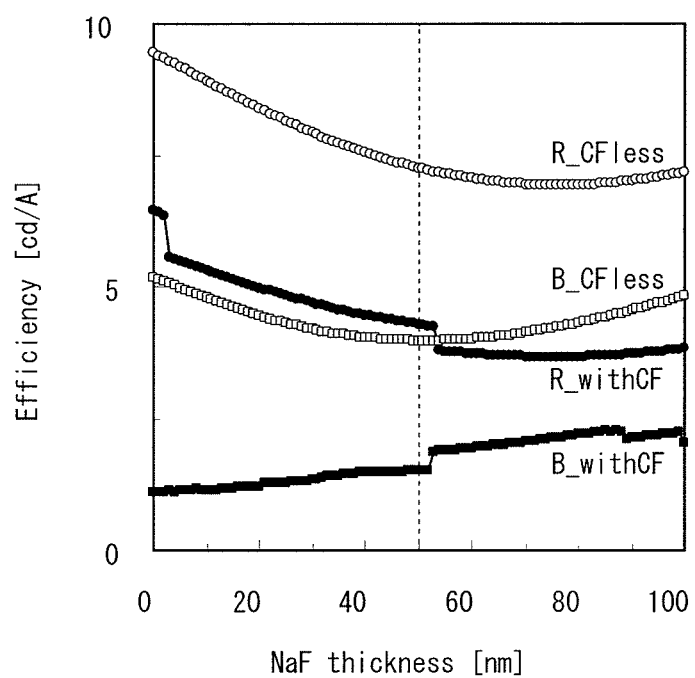
FIG. 4 illustrates change in light-extraction efficiency when film thickness of a low refractive index layer is increased from 0 nm to 100 nm.
Figures 5, 6:
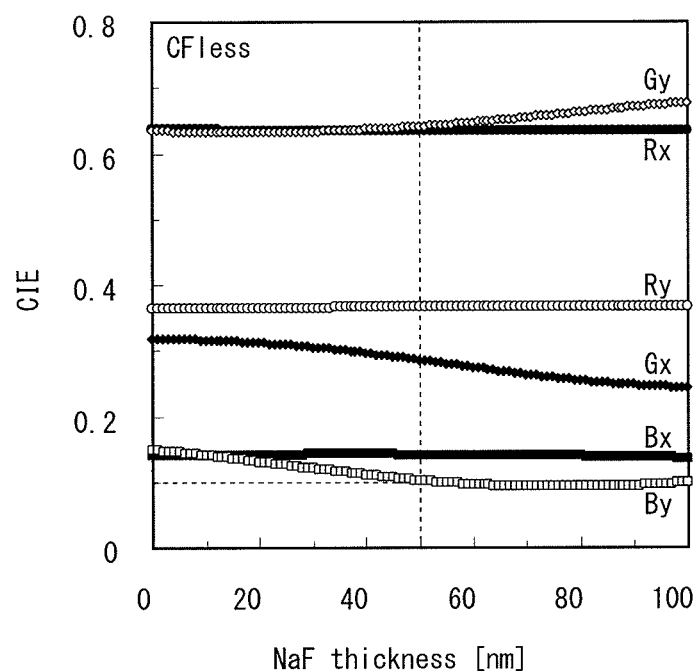
FIG. 5 illustrates change in chromaticity when film thickness of the low refractive index layer is increased from 0 nm to 100 nm.
FIG. 6 is a table illustrating light-extraction efficiency when the low refractive index layer is included and when the low refractive index layer is not included.

FIG. 4 illustrates change in light-extraction efficiency when thickness of the low refractive index layer 9 was increased from 0 nm to 100 nm under the conditions shown above. FIG. 4 illustrates the aforementioned change for a red organic light-emitting element with a color filter ("R_withCF" in FIG. 4), a red organic light-emitting element without a color filter ("R_CFless" in FIG. 4), a blue organic light-emitting element with a color filter ("B_withCF" in FIG. 4), and a blue organic light-emitting element without a color filter ("B_CFless" in FIG. 4). FIG. 5 illustrates chromaticity of light emitted from an organic light-emitting element without a color filter when thickness of the low refractive index layer 9 was increased from 0 nm to 100 nm. FIG. 5 illustrates an x value and a y value, for each of red (Rx and Ry), green (Gx and Gy), and blue (Bx and By). The x value and the y value indicate coordinates in a CIE color space.

In the case of the blue organic light-emitting element, FIG. 4 illustrates that in a range between 0 nm and 50 nm, light-extraction efficiency decreased with increasing film thickness in the configuration without a color filter, while on the other hand, light-extraction efficiency increased with increasing film thickness in the configuration with a color filter. Reasoning behind the above is that in the aforementioned film thickness range, chromaticity of light emitted by the blue organic light-emitting layer approaches target chromaticity as film thickness increases, and thus a smaller amount of color correction by the color filter is required. More specifically, as illustrated in FIG. 5, the y value for blue (By) decreased from 0.15 to 0.10 when film thickness was increased from 0 nm to 50 nm. Target chromaticity for blue in an organic light-emitting panel typically has a y value between approximately 0.06 and 0.09. Therefore, increasing film thickness in the range from 0 nm to 50 nm results in chromaticity of light emitted from the organic light-emitting layer approaching target chromaticity. If chromaticity of emitted light approaches target chromaticity in a configuration without a color filter, it is possible to achieve improved light-extraction efficiency in a configuration with a color filter, due to the color filter only being required to perform a relatively small amount of chromaticity correction.

In consideration of the above results, from among the range of thicknesses from 0 nm to 100 nm used in the present simulation, preferably the low refractive index layer 9 should have a film thickness in a range from 50 nm to 100 nm. As illustrated in FIG. 5, in the range of film thicknesses from 50 nm to 100 nm, the y value for blue (By) was constantly below a value of 0.1, and thus was close to target chromaticity. In fact, as can be seen from the curve B_withCF in FIG. 4, light-extraction efficiency was improved in the range of film thicknesses from 50 nm to 100 nm, compared to when film thickness was 0 nm (i.e., when the low refractive index layer was not included). As a specific example of the above, a light-extraction efficiency of 1.1 cd/A when film thickness was 0 nm improved to a light-extraction efficiency of 1.7 cd/A when film thickness was 50 nm, and improved to a light-extraction efficiency of 2.3 cd/A when film thickness was 85 nm.

FIG. 6 is a table illustrating light-extraction efficiency when the low refractive index layer was included and when the low refractive index layer was not included. In FIG. 6, the terms "1st cavity" and "1.5 cavity" indicate order of a resonator structure within an organic light-emitting element, which was explained based on FIG. 2A. Due to the phenomenon of light interference, light-extraction efficiency changes cyclically with increasing film thickness from zero of the functional layer, which is composed of layers located between the reflective electrode 2 and the organic light-emitting layer portions 6b, 6g, and 6r. Maximum values occurring during the above cyclical change are referred to as a 1st cavity, a 2nd cavity and a 3rd cavity in order of increasing film thickness. In terms of a resonator structure within an organic light-emitting element, in some cases the resonator structure may be a 1st cavity structure, and in some cases the resonator structure may be a 2nd cavity structure. Through research by the inventors it was discovered that a change in film thickness of the functional layer is accompanied by both a change in light-extraction efficiency and also a change in chromaticity. The inventors also discovered that a film thickness resulting in a maximum value in terms of light-extraction efficiency does not necessarily result in a chromaticity close to target chromaticity. As chromaticity deviates further from the target chromaticity, the color filter is required to perform a greater degree of chromaticity correction. Consequently, even if light-extraction efficiency is at a maximum value prior to chromaticity correction, once chromaticity correction has been performed light-extraction efficiency may no longer be a maximum value. Conversely, even if light-extraction efficiency is not a maximum value prior to chromaticity correction, once chromaticity correction has been performed light-extraction efficiency may be a maximum value. In such a situation, a configuration may be adopted in which film thickness of the functional layer is an intermediate thickness between a film thickness at which a first maximum value occurs and a film thickness at which a second maximum value occurs. For sake of simplicity, in the above situation order of resonator structure is referred to as a 1.5 cavity.

As illustrated in FIG. 6, when resonator structure within the organic light-emitting element was a 1st cavity structure and the organic light-emitting element included the low refractive index layer (NaF=85 nm), light-extraction efficiency was 2.3 cd/A for blue. On the other hand, when the organic light-emitting element did not include the low refractive index layer (NaF=0 nm), light-extraction efficiency was 1.1 cd/A for blue. In the above example, provision of the low refractive index layer enabled an approximate doubling of light-extraction efficiency. When a 1.5 cavity structure was adopted in the configuration without the low refractive index layer (NaF=0 nm), light-extraction efficiency for blue improved to 1.5 cd/A. Note that the improvement achieved through provision of the low refractive index layer was much greater than the improvement achieved through adopting the 1.5 cavity structure.

FIG. 7A is a table illustrating ranges for refractive index and film thickness of each layer, and FIG. 7B is a table illustrating a range for optical path length of each layer. The low refractive index layer has a refractive index of approximately 1.3 when sodium fluoride is used and approximately 1.4 when lithium fluoride is used. Alternatively, when silicon oxide or silicon oxynitride is used for the low refractive index layer, the low refractive index layer has a refractive index in a range from 1.4 to 1.6. When silicon oxide is used, refractive index changes in accordance with composition ratio of the silicon oxide, and when silicon oxynitride is used, refractive index changes in accordance with composition ratio of the silicon oxynitride. Based on the above, the low refractive index layer can be considered to have a refractive index of at least 1.3 and no greater than 1.6. Also, among film thicknesses in the range from 0 nm to 100 nm in the present simulation, preferably the low refractive index layer has a film thickness of at least 50 nm and no greater than 100 nm. Thus, under the above conditions an optical path length of the low refractive index layer, which is calculated by multiplication of the refractive index and the film thickness, is at least 65 nm and no greater than 160 nm.

<1-2> Second Simulation

In the first simulation film thickness of the low refractive index layer was varied in the range from 0 nm to 100 nm, and refractive index of the low refractive index layer was set as 1.3. In a second simulation film thickness and refractive index of the low refractive index layer were varied in a wider range of values. More specifically, in the second simulation film thickness of the low refractive index layer was varied in a range from 0 nm to 500 nm, and refractive index of the low refractive index layer was varied in a range from 1.0 to 2.0.

Note that refractive indices listed in the second simulation are values for light of wavelength 460 nm. However, also note that wavelength dependence is small for refractive indices of substances other than ITO, and thus for such substances it is not necessary to use different values for the refractive indices in accordance with light wavelength. On the other hand, the refractive index of ITO has large wavelength dependence, and thus it is necessary to use different values for the refractive index of ITO in accordance with light wavelength. ITO has a refractive index of 2.21 when light wavelength is 460 nm and a refractive index of 2.0 when light wavelength is 600 nm.

Figures 8, 9:
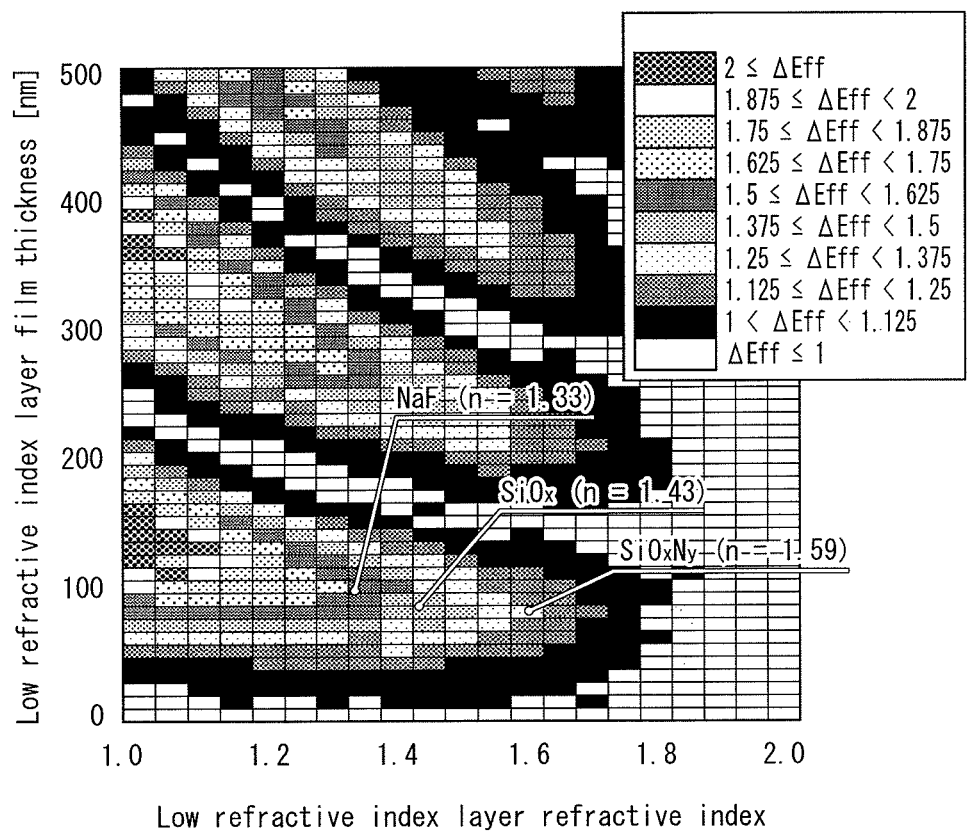
FIG. 8 is a table illustrating refractive index and film thickness of each layer in a second simulation.
FIG. 9 is a graph illustrating improvement ratio of light-extraction efficiency in the second simulation.

FIG. 8 illustrates refractive index and film thickness of each layer in the second simulation.

FIG. 9 is a graph illustrating results obtained during the second simulation.

FIG. 9 illustrates an improvement ratio of light-extraction efficiency for a blue organic light-emitting element. The light-extraction efficiency improvement ratio ΔEff is defined as $Eff_2/Eff_1$, where $Eff_1$ represents light-extraction efficiency of the organic light-emitting element when the low refractive index layer is not included, and $Eff_2$, represents light-extraction efficiency of the organic light-emitting element when the low refractive index layer is included. Herein, light-extraction efficiency was calculated for a configuration in which a color filter was provided of a type such that a y value of chromaticity was 0.06.

FIG. 9 illustrates that when refractive index of the low refractive index layer is fixed, the improvement ratio ΔEff changes cyclically in accordance with changing film thickness of the low refractive index layer. The above described result indicates that the phenomenon of light interference occurs when the low refractive index layer is included. Also, FIG. 9 illustrates that when film thickness of the low refractive index layer is fixed, the improvement ratio ΔEff is higher when the refractive index of the low refractive index layer has a low value. The above described result indicates that as refractive index of the low refractive index layer decreases, reflectance at an interface of the low refractive index layer increases, and strength of light interference also increases.

As described further above, in consideration of materials which may be used to configure the low refractive index layer, a realistic range for refractive index of the low refractive index layer is from at least 1.3 to no greater than 1.6. As can be seen from FIG. 9, when the low refractive index layer had a film thickness of at least 20 nm and no greater than 130 nm, the improvement ratio ΔEff of light-extraction efficiency was greater than 1 when refractive index of the low refractive index layer was in the aforementioned range from at least 1.3 to no greater than 1.6. In other words, under the conditions described above, light-extraction efficiency is improved compared to a configuration in which the low refractive index layer is not included (i.e., a conventional configuration). The conditions described above result in an optical path length in a film thickness direction of the low refractive index layer of at least 26 nm and no greater than 208 nm.

As can be seen from FIG. 9, when the low refractive index layer had a film thickness of at least 50 nm and no greater than 110 nm, the improvement ratio ΔEff of light-extraction efficiency was at least 1.125 when refractive index of the low refractive index layer was in the aforementioned range from at least 1.3 to no greater than 1.6. Therefore, under the conditions described above, light-extraction efficiency can be further improved. The conditions described above result in an optical path length in a film thickness direction of the low refractive index layer of at least 65 nm and no greater than 176 nm.

Figure 10:
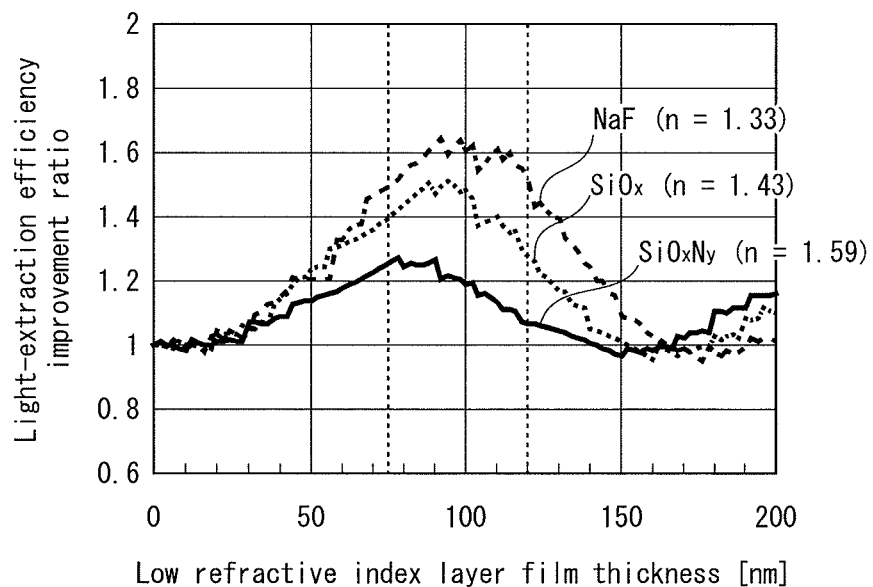
FIG. 10 illustrates a relationship between film thickness of the low refractive index layer and improvement ratio of light-extraction efficiency.

FIG. 10 illustrates improvement ratio of light-extraction efficiency for three specific examples of substances used to form the low refractive index layer. The three substances were NaF (refractive index n=1.33), $SiO_x$ (refractive index n=1.43), and $SiO_xN_y$ (refractive index n=1.59).

As illustrated in FIG. 10, when the low refractive index layer was formed from NaF, which is one example of a metal fluoride, a maximum for improvement ratio of light-extraction efficiency occurred at a film thickness of approximately 100 nm. The improvement ratio of light-extraction efficiency was approximately 1.7 at the maximum. In other words, the result described above indicates that forming the low refractive index layer from NaF enables improvement of light-extraction efficiency by a maximum of a factor of 1.7. The above result also indicates that when the low refractive index layer is formed from NaF, setting film thickness of the low refractive index layer in a range from at least 75 nm to no greater 120 nm ensures that improvement ratio of light-extraction efficiency is at least 1.53 (i.e., at least 90% of the maximum value of 1.7). The conditions described above result in an optical path length in a film thickness direction of the low refractive index layer of at least 99.8 nm and no greater than 160 nm.

<2> Viewing Angle

Figure 11:
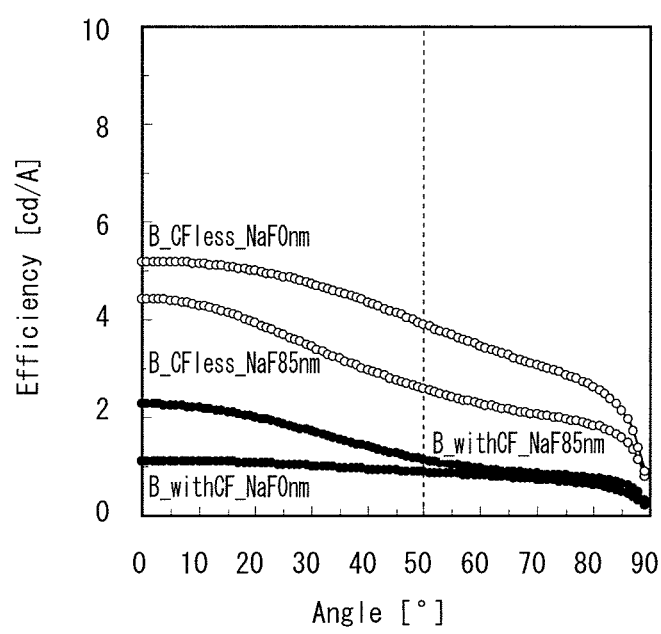
FIG. 11 illustrates viewing angle dependence of light-extraction efficiency of the blue organic light-emitting element.
Figure 12:
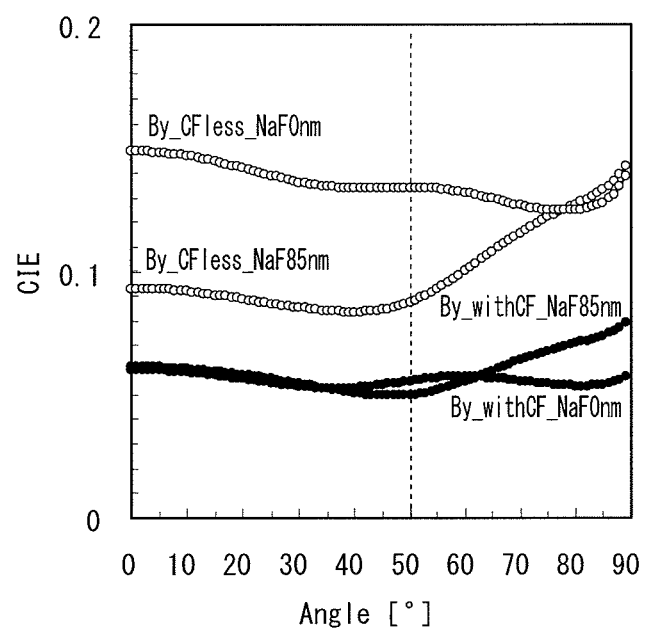
FIG. 12 illustrates viewing angle dependence of chromaticity of the blue organic light-emitting element.

FIG. 11 illustrates viewing angle dependence of light-extraction efficiency of a blue organic light-emitting element. FIG. 12 illustrates viewing angle dependence of chromaticity of the blue organic light-emitting element. FIGS. 11 and 12 each illustrate for a configuration with both a color filter and a low refractive index layer ("B_withCF_NaF85 nm" in FIGS. 11 and 12), for a configuration without the color filter and without the low refractive index layer ("B_CFless_NaF0 nm" in FIGS. 11 and 12), for a configuration with the low refractive index layer but without the color filter ("B_CFless_NaF85 nm" in FIGS. 11 and 12), and for a configuration with the color filter but without the low refractive index layer ("B_withCF_NaF0 nm" in FIGS. 11 and 12). The configuration with the color filter but without the low refractive index layer is equivalent to a comparative example, and the configuration with both the color filter and the low refractive index layer is equivalent to an example of the present invention.

As illustrated in FIG. 11, in a range of viewing angles from 0° to 50°, light-extraction efficiency was higher for the example of the present invention than for the comparative example. Also, in a range of viewing angles from 50° to 90°, light-extraction efficiency for the example of the present invention was similar to light-extraction efficiency for the comparative example. In other words, provision of the low refractive index layer enables increased brightness in a directly forward direction (i.e., a viewing angle of 0°) from the organic light-emitting panel, while also approximately maintaining brightness in a diagonal direction (for example, a viewing angle of 50°) from the organic light-emitting panel. Another strategy for increasing brightness in the directly forward direction is to increase directivity of emitted light through improvement of resonator structure. Unfortunately, increasing brightness in the directly forward direction through the above strategy results in decreased brightness in the diagonal direction. The example of the present invention enables increased brightness in the directly forward direction, while also approximately maintaining brightness in the diagonal direction, and thus requires no tradeoff between brightness in different directions such as described above.

As illustrated in FIG. 12, in a range of viewing angles from 0° to 50°, the example of the present invention had a similar chromaticity (y value) to the comparative example. Consequently, in the example of the present invention, viewing angle dependence of chromaticity can be maintained at approximately the same level as in the comparative example.

The following explains different resonator structures within an organic light-emitting element.

Figure 13A:
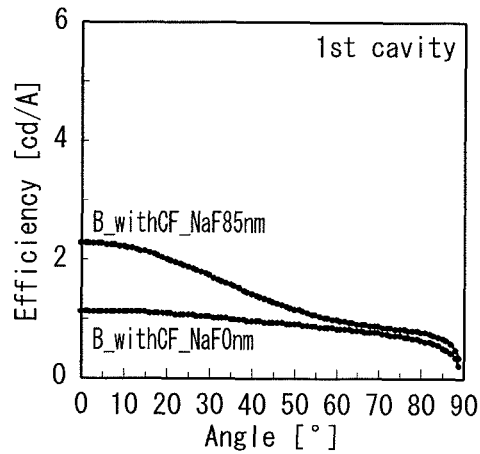
FIG. 13A illustrates viewing angle dependence of light-extraction efficiency of the blue organic light-emitting element for when resonator structure within the organic light-emitting element is a 1st cavity structure.
Figure 13B:
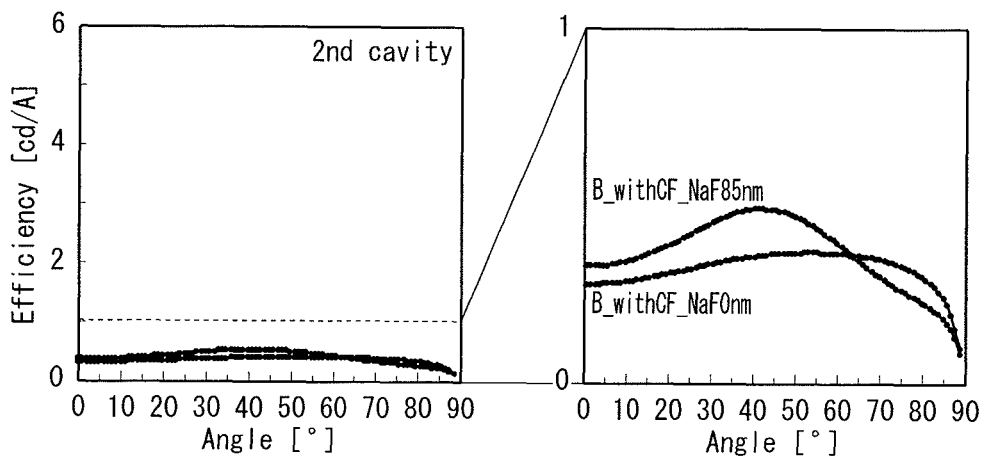
FIG. 13B illustrates for when resonator structure within the organic light-emitting element is a 2nd cavity structure.
Figure 13C:
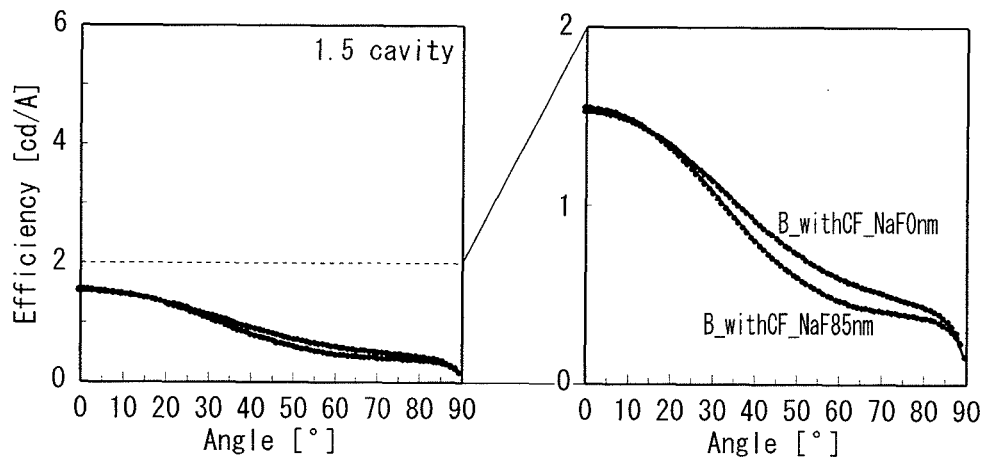
FIG. 13C illustrates for when resonator structure within the organic light-emitting element is a 1.5 cavity structure.
Figure 14:
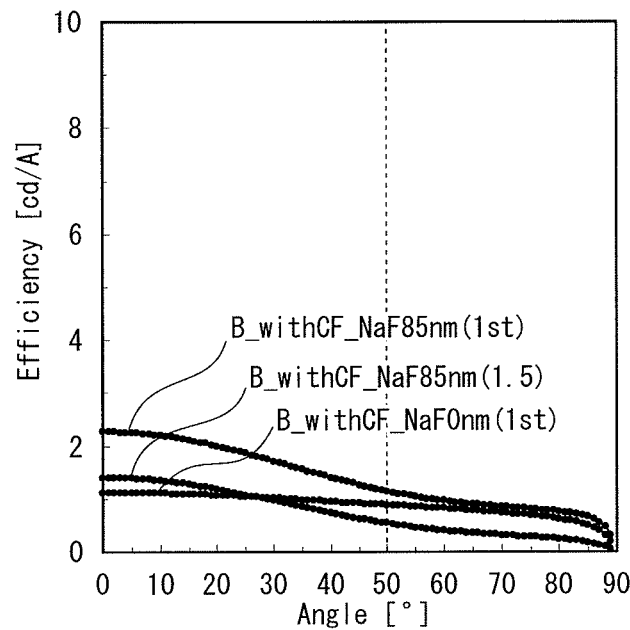
FIG. 14 illustrates overlapping of FIG. 13C for the 1.5 cavity structure with FIG. 13A for the 1st cavity structure.

FIG. 13A illustrates viewing angle dependence of light-extraction efficiency of a blue organic light-emitting element for when resonator structure within the organic light-emitting element was a 1st cavity structure, FIG. 13B illustrates for when resonator structure within the organic light-emitting element was a 2nd cavity structure, and FIG. 13C illustrates for when resonator structure within the organic light-emitting element was a 1.5 cavity structure. FIG. 13B illustrates that when resonator structure was the 2nd cavity structure, in a range of viewing angles from 0° to 50°, provision of the low refractive index layer enabled increased brightness in the directly forward direction from the organic light-emitting panel, while also approximately maintaining brightness in the diagonal direction. On the other hand, no significant effect was seen when resonator structure was the 1.5 cavity structure. FIG. 14 illustrates results for the 1.5 cavity structure overlapped with results for the 1st cavity structure. FIG. 14 illustrates that for the 1.5 cavity structure, brightness in the directly forward direction increased compared to the comparative example with the 1st cavity structure ("B_withCF_NaF0 nm" in FIG. 14), but brightness in the diagonal direction decreased. Therefore, when the low refractive index layer is included, preferably resonator structure within the organic light-emitting element should be the 1st cavity structure or the 2nd cavity structure. Note that use of the 1st cavity structure is particularly preferable in terms of improving light-extraction efficiency.

<3> Difference Between Refractive Index of Low Refractive Index Layer and Refractive Index of Layer Directly Above Low Refractive Index Layer The following considers a configuration in which refractive index of the low refractive index layer differs from refractive index of a layer located directly above the low refractive index layer. In the above simulations, a configuration was assumed in which a first thin-film sealing layer is layered on the low refractive index layer. In contrast to the above, the present simulation assumed a configuration in which a glass substrate is layered on the low refractive index layer. In the above simulations, a difference between respective refractive indices of the low refractive index layer and the layer located thereon was 0.6, but in the present simulation the difference between respective refractive indices of the low refractive index layer and the layer located thereon was 0.2.

Figure 15:
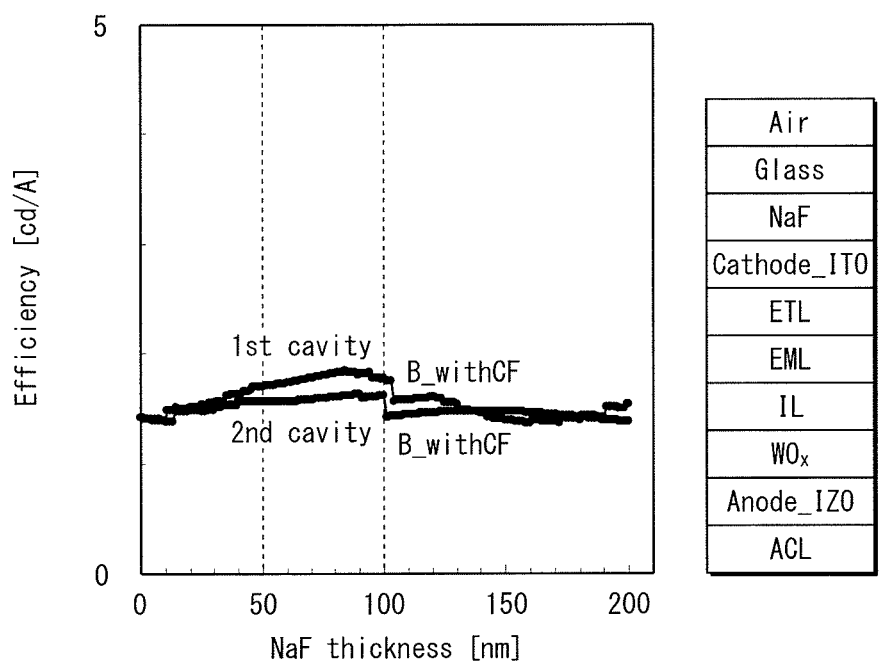
FIG. 15 illustrates change in light-extraction efficiency when film thickness of the low refractive index layer is increased from 0 nm to 200 nm in a structure which does not include a sealing layer.

FIG. 15 illustrates change in light-extraction efficiency when film thickness of the low refractive index layer was increased from 0 nm to 200 nm under the conditions described above. FIG. 15 illustrates for when resonator structure within the organic light-emitting element was a 1st cavity structure and for when resonator structure within the organic light-emitting element was a 2nd cavity structure. As illustrated in FIG. 15, light-extraction efficiency improved when the low refractive index layer had a film thickness in range from 50 nm to 100 nm. The above indicates that provision of the low refractive index layer enables improved light-extraction efficiency, even in the configuration in which the layer located on the low refractive index layer is a glass substrate.

Figure 16:
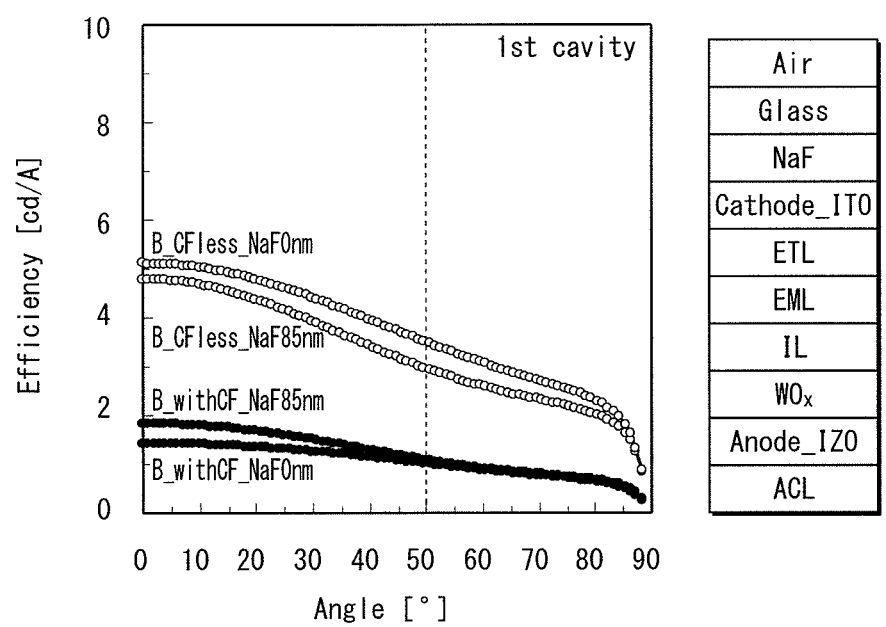
FIG. 16 illustrates viewing angle dependence of light-extraction efficiency of the blue organic light-emitting element in a structure which does not include a sealing layer.

FIG. 16 illustrates viewing angle dependence of light-extraction efficiency of a blue organic light-emitting element under the conditions described above. A configuration with both a color filter and a low refractive index layer ("B_with-CF_NaF85 nm" in FIG. 16) is equivalent to an example of the present invention, and a configuration with the color filter but without the low refractive index layer ("B_CFless_NaF0 nm" in FIG. 16) is equivalent to a comparative example.

As illustrated in FIG. 16, in a range of viewing angles from 0° to 50°, light-extraction efficiency was higher for the example of the present invention than for the comparative example. Also, in a range of viewing angles from 50° to 90°, light-extraction efficiency for the example of the present invention was similar to light-extraction efficiency for the comparative example. The above results indicate that even if a difference between respective refractive indices of the low refractive index layer and the layer located thereon is approximately 0.2, it is still possible to increase brightness in a directly forward direction (i.e., a viewing angle of 0°) from the organic light-emitting panel, while approximately maintaining brightness in a diagonal direction (for example, a viewing angle of 50°) from the organic light-emitting panel.

Note that improvement in light-extraction efficiency was greater for the example of the present invention illustrated in FIG. 11 than for the example of the present invention illustrated in FIG. 16. A possible reason for the above is that compared to a difference of 0.2 between respective refractive indices of the low refractive index layer and the glass substrate in the example of the present invention illustrated in FIG. 16, difference between respective refractive indices of the low refractive index layer and the sealing layer in the example of the present invention illustrated in FIG. 11 has a greater value of 0.6, and thus light interference is stronger for the example illustrated in FIG. 11.

<4> Functional Layer Film Thickness

Figure 17A:
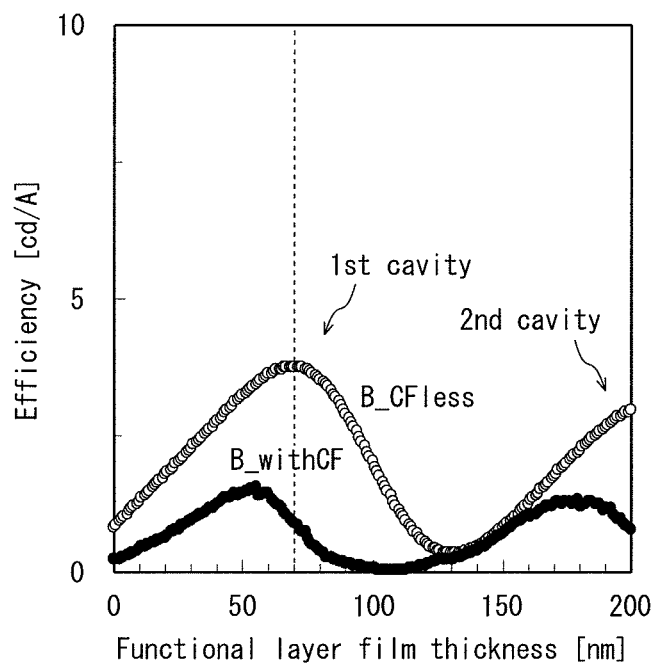
FIG. 17A illustrates change in light-extraction efficiency when film thickness of a functional layer is increased from 0 nm to 200 nm for a configuration in which refractive index of each layer is an intermediate value (Ave.) in FIG. 7A and thickness of each layer, other than the functional layer, is a minimum value (Min.) in FIG. 7A.
Figure 17B:
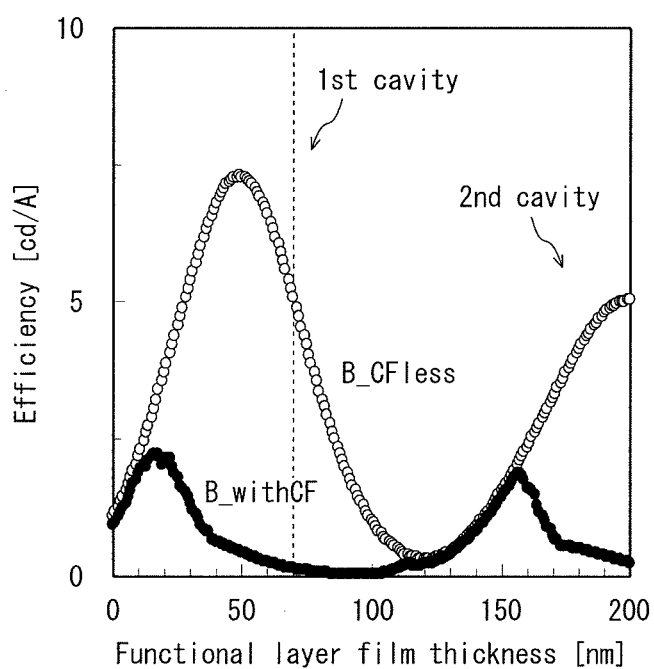
FIG. 17B illustrates for a configuration in which refractive index of each layer is the intermediate value (Ave.) in FIG. 7A and film thickness of each layer, other than the functional layer, is a maximum value (Max.) in FIG. 7A.

The following considers film thickness of the functional layer (i.e., a layer composed of the transparent conductive layer, the hole injection layer and the hole transport layer). FIGS. 17A and 17B illustrate change in light-extraction efficiency when film thickness of the functional layer was increased from 0 nm to 200 nm. FIG. 17A illustrates for a configuration in which refractive index of each layer was an intermediate value (Ave.) in FIG. 7A and thickness of each layer, other than the functional layer, was a minimum value (Min.) in FIG. 7A. FIG. 17B illustrates for a configuration in which refractive index of each layer was the intermediate value (Ave.) in FIG. 7A and film thickness of each layer, other than the functional layer, was a maximum value (Max.) in FIG. 7A. FIGS. 17A and 17B illustrate that a first maximum for light-extraction efficiency occurred at a film thickness of the functional layer in a range from 0 nm to 70 nm, regardless of whether film thickness of each of the other layers was the maximum value or the minimum value.

Figure 18A:
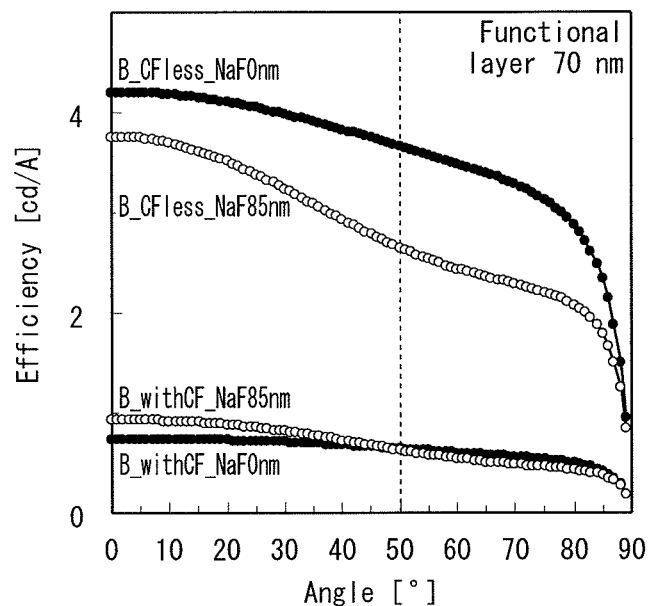
FIGS. 18A and 18B each illustrate viewing angle dependence of light-extraction efficiency of the blue organic light-emitting element.
Figure 18B:
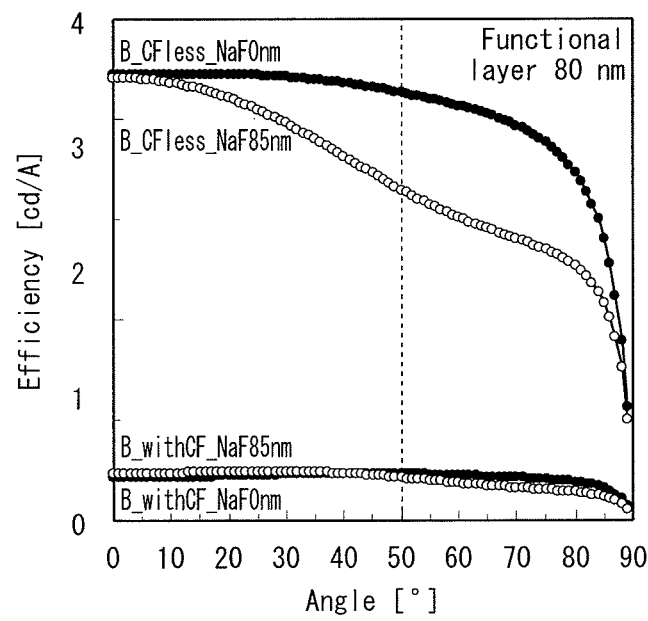

FIGS. 18A and 18B illustrate viewing angle dependence of light-extraction efficiency of a blue organic light-emitting element. FIG. 18A illustrates for when the functional layer had a film thickness of 70 nm, and FIG. 18B illustrates for when the functional layer had a film thickness of 80 nm. A configuration with both a color filter and a low refractive index layer ("B_withCF_NaF85 nm" in FIGS. 18A and 18B) is equivalent to an example of the present invention, and a configuration with the color filter but without the low refractive index layer ("B_CFless_NaF0 nm" in FIGS. 18A and 18B) is equivalent to a comparative example.

When the functional layer had a film thickness of 70 nm, compared to the configuration without the low refractive index layer, the configuration with the low refractive index layer had higher light-extraction efficiency in a directly forward direction (i.e., a viewing angle of 0°), while also maintaining light-extraction efficiency in a diagonal direction (i.e., a viewing angle of 50°). When the functional layer had a film thickness of 80 nm, compared to the configuration without the low refractive index layer, the configuration with the low refractive index layer had higher light-extraction efficiency in the directly forward direction, but had lower light-extraction efficiency in the diagonal direction.

The above results indicate that it is preferable that the functional layer of the blue organic light-emitting element has film thickness of at least 0 nm and no greater than 70 nm when a 1st cavity structure is to be adopted in the organic light-emitting element. The conditions described above result in the functional layer having an optical path length of at least 0 nm and no greater than 161 nm. Note that a range of appropriate film thicknesses for the functional layer differs for each color. For example, in each of a green organic light-emitting element and a red organic light-emitting element, the functional layer may have a film thickness of at least 0 nm and no greater than 80 nm. The conditions described above result in the functional layer having an optical path length of at least 0 nm and no greater than 184 nm.

<5> Theoretical Discussion

The following considers theoretical basis for improved light-extraction efficiency occurring as a result of provision of the low refractive index layer.

Figure 19:
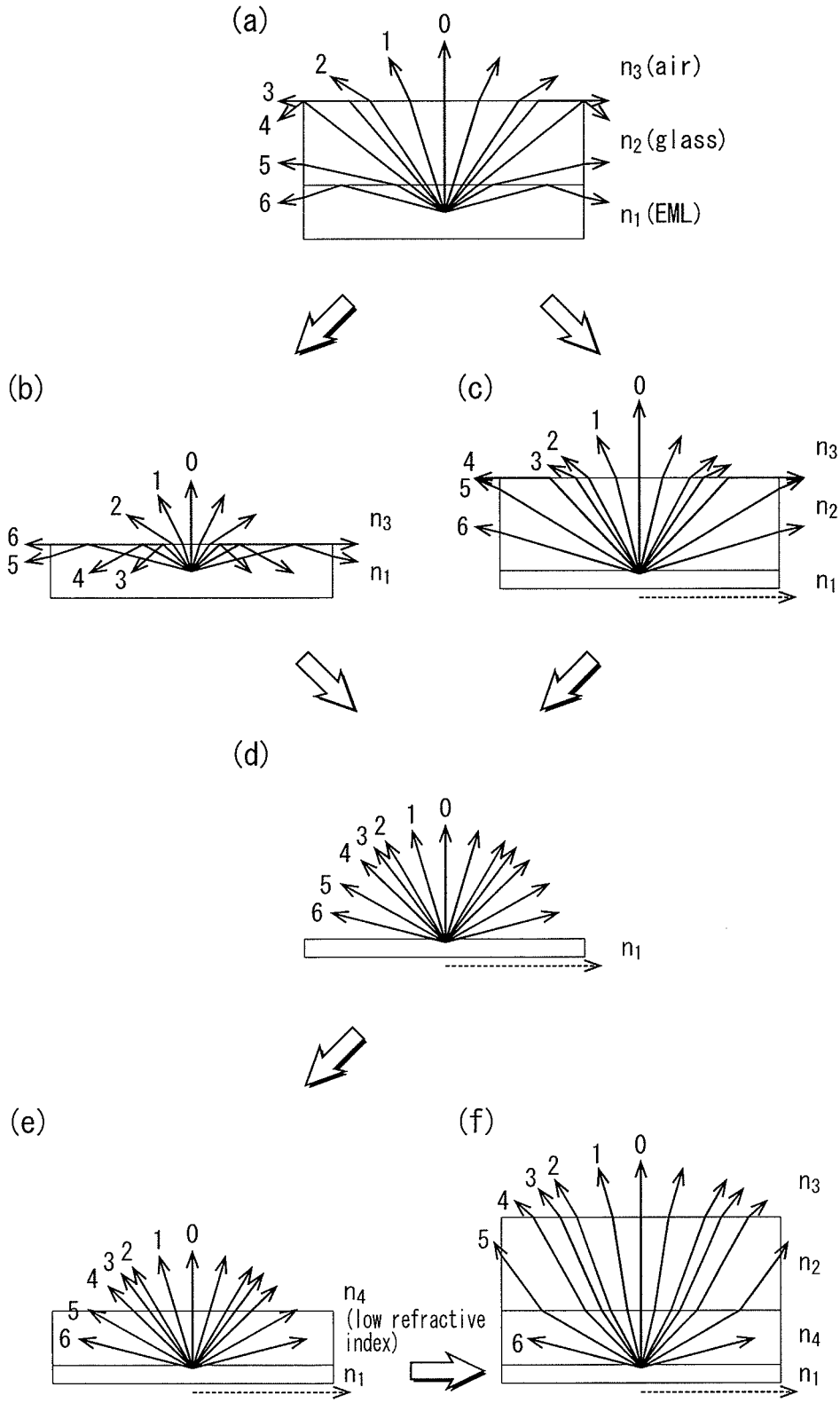
FIG. 19 schematically illustrates, in sections (a)-(e), emission of light externally from the light-emitting layer.

FIG. 19 schematically illustrates external light-emission from a light-emitting layer. Section (a) of FIG. 19 illustrates a model of a two layer structure in which glass is layered on the light-emitting layer ("EML" in FIG. 19). Refractive index $n_1$ of the light-emitting layer, refractive index $n_2$ of the glass, and refractive index $n_3$ of air satisfy a relationship $n_1 > n_2 > n_3$. Section (b) of FIG. 19 illustrates a model in which the glass is removed. Due to increased propagation of light waves within the light-emitting layer, the model in section (b) does not result in improved light-extraction efficiency. Section (c) of FIG. 19 illustrates a model in which the light-emitting layer is provided as a thin film in order to reduce propagation of light waves within the light-emitting layer. However, the model in section (c) does not result in improved light-extraction efficiency. Section (d) of FIG. 19 illustrates a model in which the glass is removed and the light-emitting layer is provided as a thin film. Propagation of light waves within the light-emitting layer is reduced in the model in section (d), resulting in improved light-extraction efficiency. Unfortunately, a configuration in which the light-emitting layer is exposed to air is not a realistic configuration for an actual product. Section (e) of FIG. 19 illustrates a model in which the light-emitting layer is provided as a thin film and a low refractive index layer is layered on the light-emitting layer. Refractive index $n_4$ of the low refractive index layer satisfies $n_1 > n_4$ and $n_2 > n_4$. The model in section (e) results in improved light-extraction efficiency. Section (f) of FIG. 19 illustrates a model of a three layer structure including the light-emitting layer, the low refractive index layer and the glass, in which the light-emitting layer is provided as a thin-film. In the model in section (f), light is refracted toward a directly forward direction at an interface between the low refractive index layer and the glass, resulting in a larger amount of light being extracted in the directly forward direction. Improved light-extraction efficiency is considered to occur as a result of the above.

Specific Examples of Each Layer

<Substrate>

The substrate 1 is for example a thin film transistor (TFT) substrate. The substrate 1 may for example be made from a quartz or glass plate, such as of soda glass, non-fluorescent glass, phosphate glass or borate glass, a plastic plate or film, such as of acrylic resin, styrene resin, polycarbonate resin, epoxy resin, polyethylene, polyester or silicone resin, or a metal plate or foil, such as of alumina.

<Banks>

The banks 15 should be formed from an insulating material, and preferably the banks 15 should be resistant to organic solvents. Furthermore, since the banks 15 undergo processing such as etching and baking, the banks 15 should preferably be formed from a material that has a high resistance to such processing. The banks 15 may be made from an organic material such as a resin, or may be made from an inorganic material such as glass. Examples of organic materials which can be used include acrylic resin, polyimide resin and novolac phenolic resin, while examples of inorganic materials which can be used included silicon oxide ($SiO_x$) and silicon nitride ($SiN_x$).

<Reflective Electrode>

The reflective electrode 2 is electrically connected to a TFT of the substrate 1. The reflective electrode 2 functions as a positive electrode for the organic light-emitting elements, and also functions to reflect light emitted toward the reflective electrode 2 from the light-emitting layer portions 6b, 6g, and 6r. The function of reflectivity can be implemented either through a structural material of the reflective electrode 2, or through a reflective coating applied to an upper surface of the reflective electrode 2. The reflective electrode 2 may be for example be formed from silver (Ag), an alloy of silver, palladium and copper (APC), an alloy of silver, rubidium and gold (ARA), an alloy of molybdenum and chromium (MoCr), an alloy of nickel and chromium (NiCr), or an alloy of aluminum, cobalt and lanthanum (ACL).

<Transparent Conductive Layer>

The transparent conductive layer 3 functions as a protective layer for preventing natural oxidization of the reflective electrode 2 from occurring during production. The transparent conductive layer 3 should be formed from a conductive material that is sufficiently light-transmitting with regards to light emitted from the organic light-emitting layer portions 6b, 6g and 6r. For example, the transparent conductive layer 3 may be formed from ITO or indium zinc oxide (IZO). Good conductivity can be achieved with ITO or IZO, even if a film thereof is formed at room temperature.

<Hole Injection Layer>

The hole injection layer 4 has a function of injecting holes into the organic light-emitting layer portions 6b, 6g and 6r. The hole injection layer 4 is formed from an oxide of a transition metal such as tungsten oxide ($WO_x$), molybdenum oxide ($MoO_x$), or molybdenum tungsten oxide ($Mo_xW_yO_z$). Forming the hole injection layer 4 from an oxide of a transition metal enables improvement of voltage-current density properties and increase of emission intensity through increased current density. Note that other metal compounds may alternatively be used, such as a nitride of a transition metal.

<Hole Transport Layer>

The hole transport layer 5 can be formed from a material such as a triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound and styrylamine compound, butadiene compound, polystyrene derivative, hydrazone derivative, triphenylmethane derivative, or tetraphenylbenzene derivative as disclosed in Japanese Patent Application Publication No. H5-163488. Use of a porphyrin compound, aromatic tertiary amine compound and styrylamine compound is particularly preferable.

<Organic Light-Emitting Layer Portions>

The organic light-emitting layer portions 6b, 6g and 6r are formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, or rare earth metal complex as disclosed in Japanese Patent Application Publication No. H5-163488.

<Electron Transport Layer>

The electron transport layer 7 can be formed from a material such as a nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, or quinolone complex derivative as disclosed in Japanese Patent Application Publication No. H5-163488.

Note that the material described above, configuring the electron transport layer, may be doped with an alkali metal or alkaline earth metal, such as Na, Ba or Ca, in order to improve electron injection properties.

<Transparent Electrode>

The transparent electrode 8 functions as a negative electrode for the organic light-emitting elements. The transparent electrode 8 should be formed from a conductive material that is sufficiently light-transmitting with regards to light emitted from the organic light-emitting layer portions 6b, 6g and 6r. For example, the transparent electrode 8 may be formed from ITO or IZO.

<Low Refractive Index Layer>

The low refractive index layer 9 should have a refractive index which is lower than a refractive index of a layer located directly below low refractive index layer 9 (i.e., the transparent electrode 8 in the present embodiment), and which is also lower than a refractive index of a layer located directly above low refractive index layer 9 (i.e., the first thin-film sealing layer 10 in the present embodiment). The low refractive index layer 9 may for example be formed from a material such as a metal fluoride, silicon oxide, or silicon oxynitride. Examples of metal fluorides which may be used include alkali metal fluorides and alkaline earth metal fluorides. The alkali metal fluoride may be lithium fluoride, sodium fluoride, potassium fluoride, rubidium fluoride, cesium fluoride, or francium fluoride. The alkaline earth metal fluoride may be beryllium fluoride, magnesium fluoride, calcium fluoride, strontium fluoride, barium fluoride, or radium fluoride.

<First Thin-Film Sealing Layer>

The first thin-film sealing layer 10 has a function of preventing moisture and oxygen from penetrating to the organic light-emitting elements. The first thin-film sealing layer 10 can for example be formed from silicon nitride ($SiN_x$) or silicon oxynitride ($SiO_xN_y$). Silicon nitride and silicon oxynitride are suitable sealing materials due to each having a dense crystal structure, and thus having a high degree of impermeability with regards to moisture and oxygen.

<Second Thin-Film Sealing Layer>

The second thin-film sealing layer 11 has a function of further increasing sealing properties by filling gaps that arise in the first thin-film sealing layer 10. The second thin-film sealing layer 11 can for example be formed from aluminum oxide ($AlO_x$). Note that any material that can be formed as a thin-film through atomic layer deposition may used as an alternative to aluminum oxide.

<Resin Sealing Layer>

The resin sealing layer 12 has a function of adhering a back panel, composed of layers from the substrate 1 through to the second thin-film sealing layer 11, to a front panel, composed of the substrate 14 and the color filters 13b, 13g, and 13r. The resin sealing layer 12 also has a function of preventing other layers from being exposed to moisture and oxygen. The resin sealing layer 12 is for example formed from a resin adhesive.

<Color Filters>

The color filters 13b, 13g and 13r have a function of correcting chromaticity of light emitted from the organic light-emitting elements.

<Substrate>

The substrate 14 may for example be made of a quartz or glass plate, such as of soda glass, non-fluorescent glass, phosphate glass or borate glass, or a plastic plate or film, such as of acrylic resin, styrene resin, polycarbonate resin, epoxy resin, polyethylene, polyester or silicone resin.

[Organic Display Device]

Figure 20:
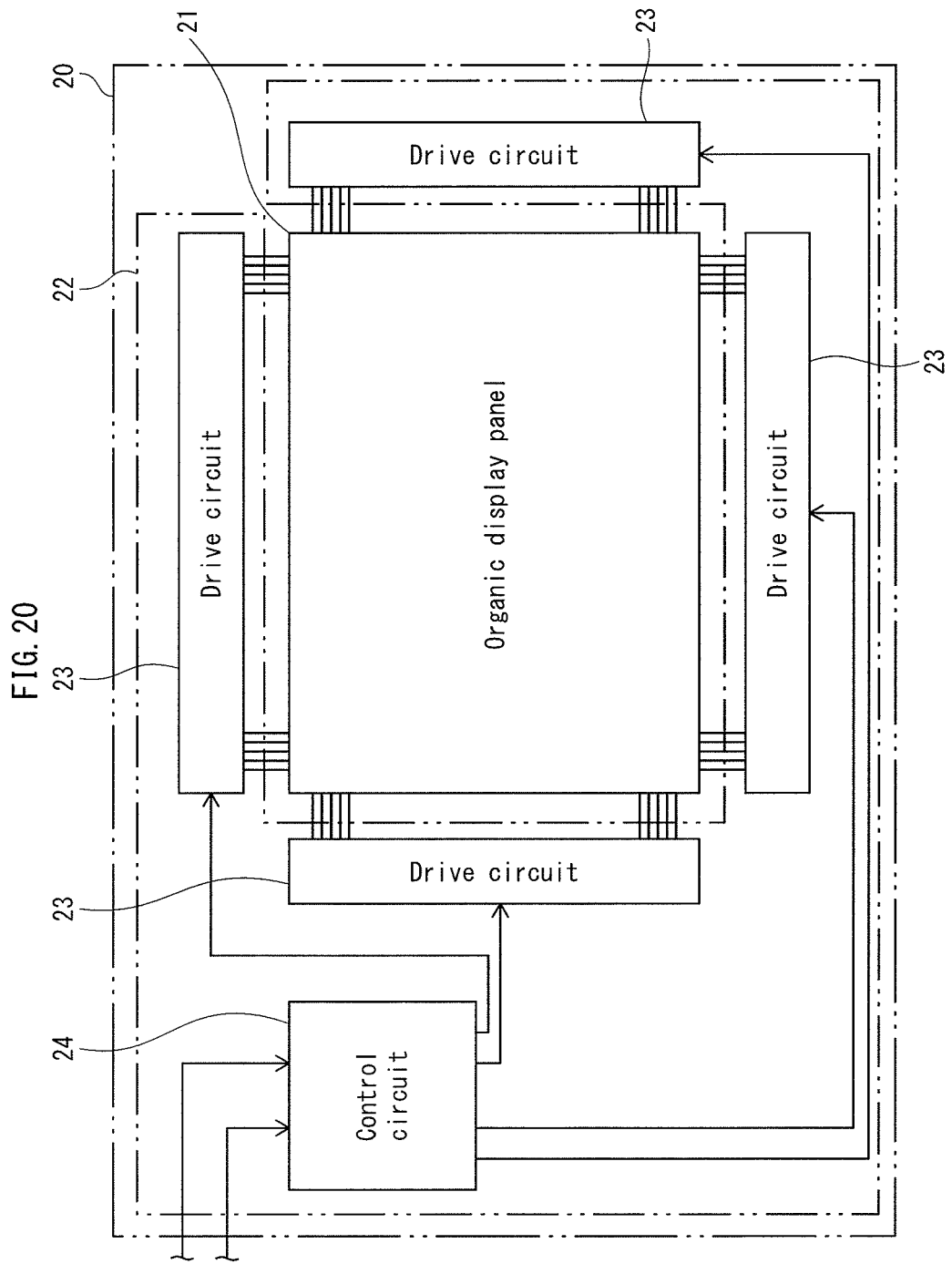
FIG. 20 illustrates functional blocks of an organic display device relating to an embodiment of the present invention.
Figure 21:
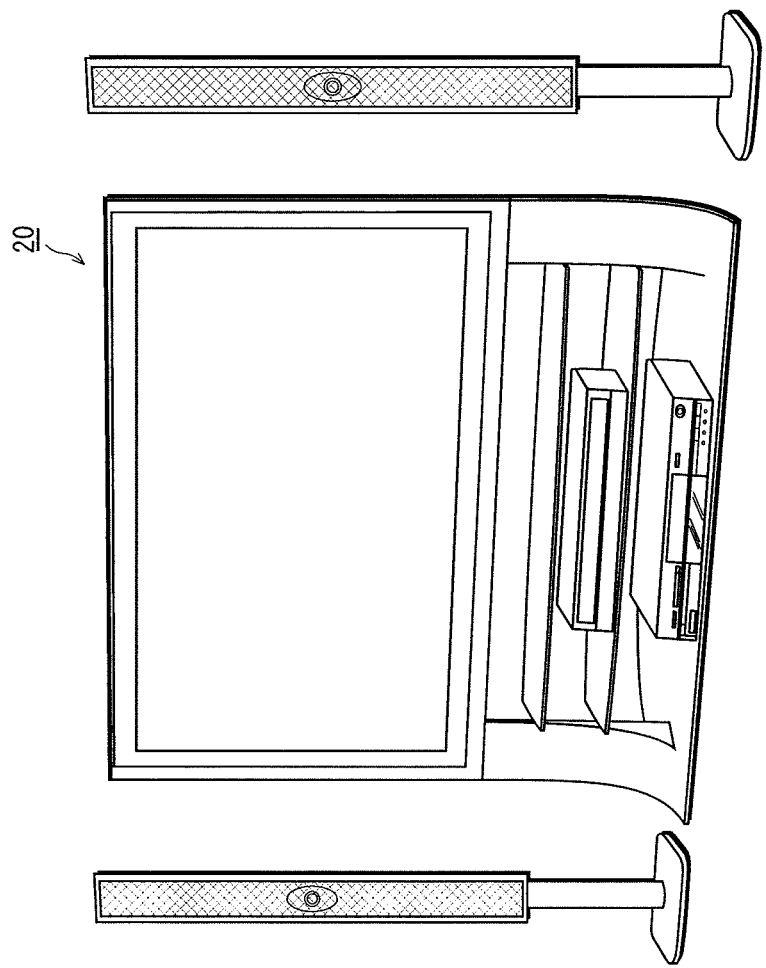
FIG. 21 illustrates an example of external appearance of the organic display device relating to the embodiment of the present invention.

FIG. 20 illustrates functional blocks of an organic display device relating to an embodiment of the present invention. FIG. 21 illustrates an example of external appearance of the organic display device relating to the embodiment of the present invention. Organic display device 20 includes an organic display panel 21 and a drive controller 22 which are electrically connected to one another. The organic display panel 21 has the same pixel structure as illustrated in FIG. 1. The drive controller 22 includes drive circuits 23 and a control circuit 24. The drive circuits 23 apply a voltage between the reflective electrode 2 and the transparent electrode 8 for each organic light-emitting element, and the control circuit 24 controls operation of the drive circuits 23.

[Method for Producing Organic Light-Emitting Panel]

The following explains a method for producing an organic light-emitting panel. FIGS. 22A-22D, 23A-23C, 24A and 24B are diagrams for explaining a method for producing the organic light-emitting panel relating to the embodiment of the present invention.

Figure 22A:
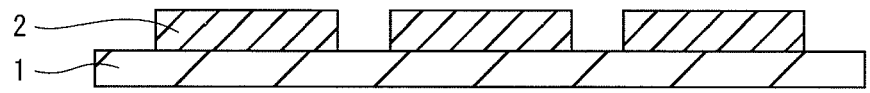
FIGS. 22A-22D are diagrams for explaining a method for producing the organic light-emitting panel relating to the embodiment of the present invention.
Figure 22B:
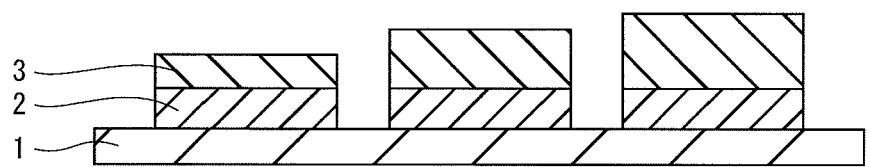

The reflective electrode 2 is first formed on the substrate 1 by vapor deposition or sputtering (FIG. 22A). The transparent conductive layer 3 is subsequently formed on the reflective electrode 2 by vapor deposition or sputtering (FIG. 22B).

Figure 22C:
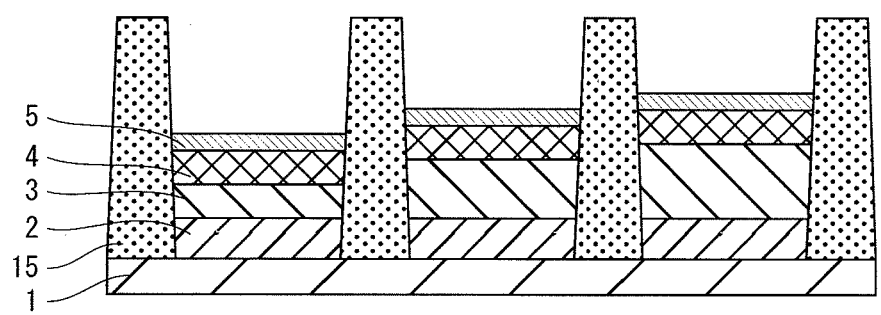

Next, the hole injection layer 4 is formed on the transparent conductive layer 3, for example by vapor deposition or sputtering, the banks 15 are formed, and the hole transport layer 5 is formed on the hole injection layer 4, for example by an inkjet method or other printing method (FIG. 22C). Note that film thickness of the functional layer (i.e., a layer composed of the transparent conductive layer 3, the hole injection layer 4 and the hole transport layer 5) is set individually for each of the R, G, and B colors such that resonator structure is either a 1st cavity structure or a 2nd cavity structure. When the 1st cavity structure is adopted, film thickness of the functional layer is set as no greater than 70 nm and optical path length of the functional layer is set as no greater than 161 nm.

Figure 22D:
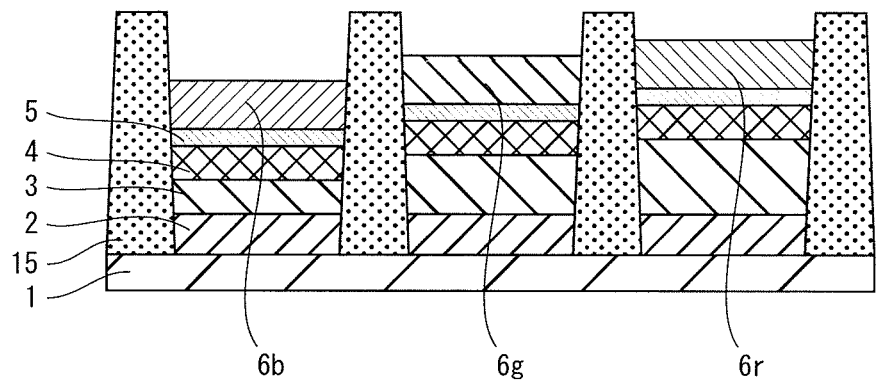

Next, the organic light-emitting layer portions 6b, 6g and 6r are formed on the hole transport layer 5, for example by an inkjet method or other printing method (FIG. 22D).

Figure 23A:
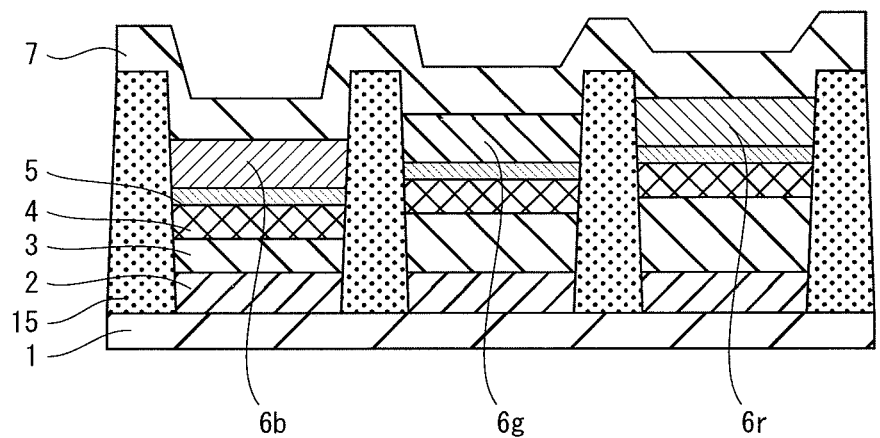
FIGS. 23A-23C are diagrams for explaining the method for producing the organic light-emitting panel relating to the embodiment of the present invention.

The electron transport layer 7 is subsequently formed on the organic light-emitting layer portions 6b, 6g and 6r by vapor deposition or sputtering (FIG. 23A).

Figure 23B:
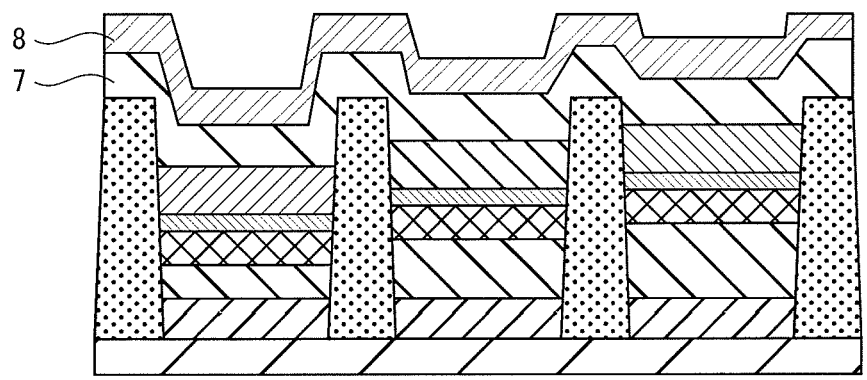

Next, the transparent electrode 8 is formed on the electron transport layer 7 by vapor deposition or sputtering (FIG. 23B). Film thickness of the transparent electrode 8 is set as at least 30 nm and no greater than 40 nm, refractive index of the transparent electrode 8 is set as at least 2.0 and no greater than 2.4, and optical path length of the transparent electrode 8 is set as at least 60 nm and no greater than 96 nm.

Figure 23C:
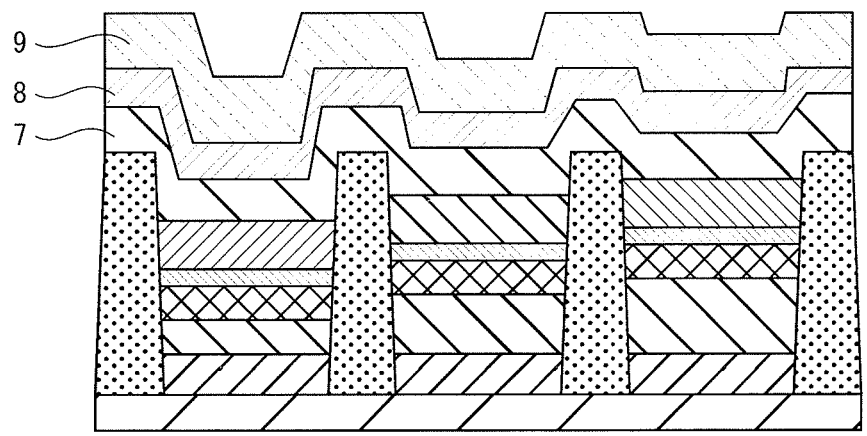

Next, the low refractive index layer 9 is formed on the transparent electrode 8 by vapor deposition or sputtering (FIG. 23C). Film thickness of the low refractive index layer 9 is set as at least 50 nm and no greater than 130 nm, refractive index of the low refractive index layer 9 is set as at least 1.3 and no greater than 1.6, and optical path length of the low refractive index layer 9 is set as at least 26 nm and no greater than 208 nm.

Figure 24A:
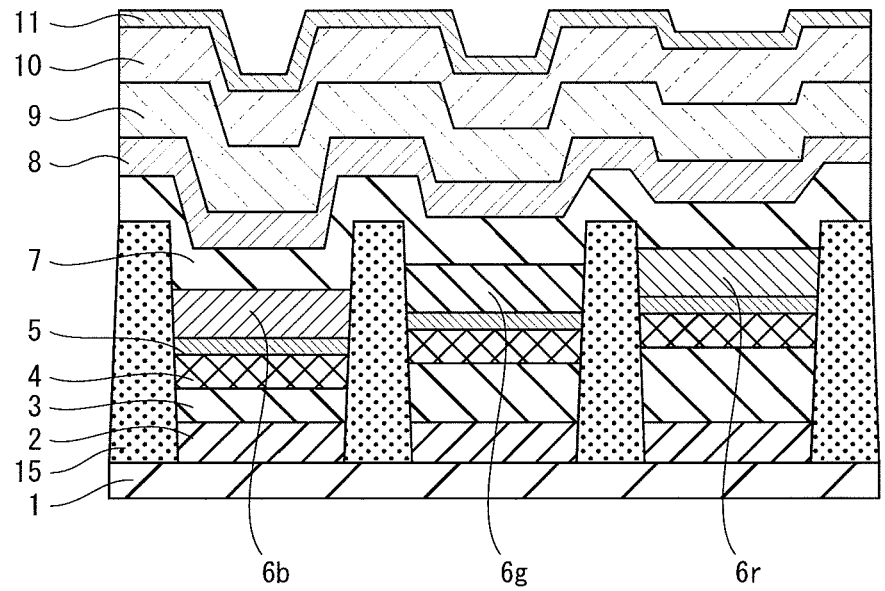
FIGS. 24A and 24B are diagrams for explaining the method for producing the organic light-emitting panel relating to the embodiment of the present invention.

Next, the first thin-film sealing layer 10 is formed on the low refractive index layer 9 by vapor deposition, sputtering or chemical vapor deposition, and subsequently the second thin-film sealing layer 11 is formed on the first thin-film sealing layer 10 by atomic layer deposition (FIG. 24A). Film thickness of the first thin-film sealing layer 10 is set as at least 100 nm and no greater than 680 nm, refractive index of the first thin-film sealing layer 10 is set as at least 1.7 and no greater than 2.1, and optical path length of the first thin-film sealing layer 10 is set as at least 170 nm and no greater than 1428 nm.

Figure 24B:
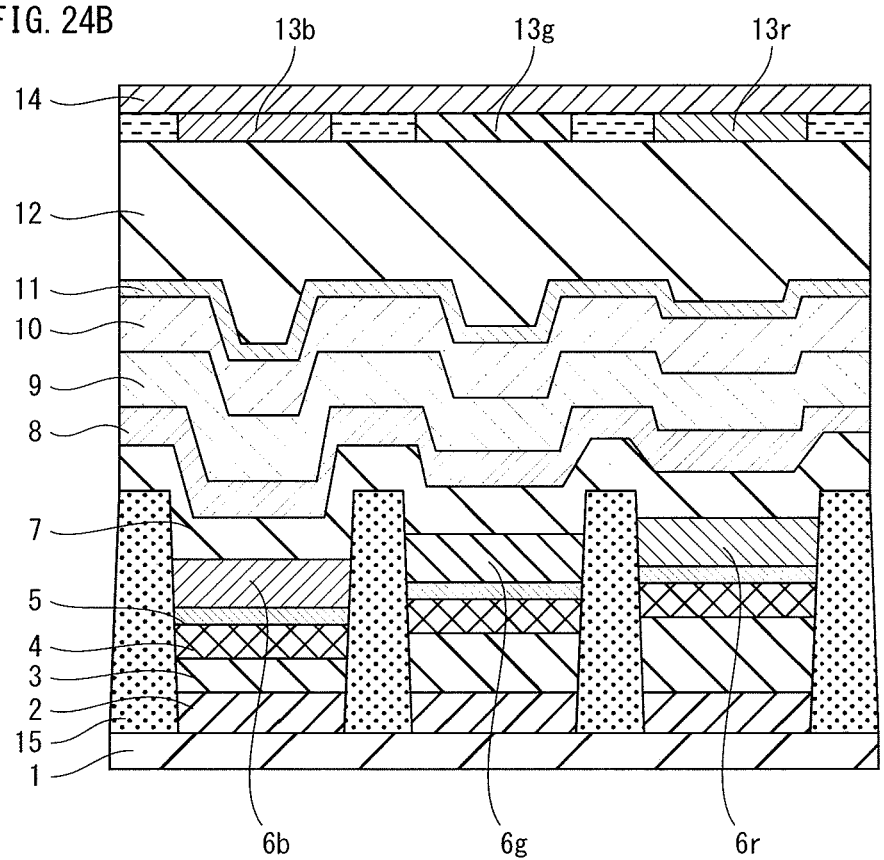

Next, the resin sealing layer 12 is used in order to adhere the second thin-film sealing layer 11 to the substrate 14 on which the color filters 13b, 13g and 13r have been formed (FIG. 24B). Film thickness of the resin sealing layer 12 is for example set as at least 1000 nm and no greater than 10000 nm.

Modified Examples

The present invention is not limited to the embodiment described above, and various modified examples are possible such as described below.

<1> The embodiment is an example in which the functional layer, located between the reflective electrode and the organic light-emitting layer, includes the transparent conductive layer, the hole injection layer, and the hole transport layer. However, the functional layer is not limited to the above example, and alternatively may not include all of the aforementioned layers, or may additionally include layers other than the aforementioned layers.

<2> The embodiment is an example in which the electron transport layer is present between the organic light-emitting layer and the transparent electrode, but the above example is not a limitation. For example, alternatively the electron transport layer may be omitted, or a different layer such as an electron injection layer may be present between the organic light-emitting layer and the transparent electrode.

<3> The embodiment is an example in which a thin-film sealing layer is provided as a two layer structure composed of the first thin-film sealing layer and the second thin-film sealing layer, but the thin-film sealing layer is not limited to the above example. For example, alternatively the thin-film sealing layer may have a single layer structure, or may have a multi-layer structure composed of three or more layers.

<4> The embodiment is an example in which a sealing layer composed of the first thin-film sealing layer, the second thin-film sealing layer, and the resin sealing layer is layered on the low refractive index layer, but the sealing layer is not limited to the above example. For example, alternatively the sealing layer may be omitted.

<5> In the embodiment conditions (a) to (e) shown below are satisfied with regards to refractive index. Note that it is not actual values of refractive indices of the layers which are important in achieving light interference, but instead it is differences between the refractive indices of the layers which are important. Consequently, at least conditions (d) and (e) should be satisfied from among the conditions (a) to (e) relating to refractive index.

$$2.0 \leq n_a \leq 2.4 \tag{a}$$

$$1.3 \leq n_b \leq 1.6 \tag{b}$$

$$1.7 \leq n_c \leq 2.1 \tag{c}$$

$$0.4 \leq \Delta n_{ab} \leq 1.1 \tag{d}$$

$$0.1 \leq \Delta n_{bc} \leq 0.8 \tag{e}$$

<6> In the embodiment the low refractive index layer is located on the transparent electrode, and the first thin-film sealing layer is located on the low refractive index layer. However, in terms of optical design, it is not essential that a sealing layer is located on the low refractive index layer. Alternatively, a different layer may be provided on the low refractive index layer in order to achieve a different objective, for example a layer may be provided with a sole objective of optical adjustment.

INDUSTRIAL APPLICABILITY

The present invention is applicable for use in an organic EL display or other similar device.

REFERENCE SIGN LIST 1 substrate
2 reflective electrode
3 transparent conductive layer
4 hole injection layer
5 hole transport layer
6b, 6g, 6r organic light-emitting layer portion
7 electron transport layer
8 transparent electrode
9 low refractive index layer
10 first thin-film sealing layer
11 second thin-film sealing layer 12 resin sealing layer
13b, 13g, 13r color filter
14 substrate
15 banks
20 organic display device
21 organic display panel
22 drive controller
23 drive circuit
24 control circuit

The invention claimed is:

1. An organic light-emitting panel, comprising:
a first electrode that is light-reflecting;
a functional layer having a single layer or multi-layer structure, located on the first electrode;
an organic light-emitting layer located on the functional layer, the organic light-emitting layer including a red organic light-emitting layer portion defining a red organic light-emitting element, a green organic light-emitting layer portion defining a green organic light-emitting element, and a blue organic light-emitting layer portion defining a blue organic light-emitting element;
a second electrode that is light-transmitting, located above the organic light-emitting layer;
a first layer located on the second electrode;
a second layer located on the first layer;
a sealing layer located on the second layer, the sealing layer composed of aluminum oxide;
a resin sealing layer located on the sealing layer; and
a substrate located on the resin sealing layer, the substrate being adhered to the sealing layer via the resin sealing layer, wherein
a refractive index of the second electrode is at least 2.0 and no greater than 2.4,
a refractive index of the first layer is at least 1.3 and no greater than 1.6,
a refractive index of the second layer is at least 1.7 and no greater than 2.1,
the refractive index of the first layer is lower than the refractive index of the second electrode, and a difference between the refractive index of the first layer and the refractive index of the second electrode is at least 0.4 and no greater than 1.1,
the refractive index of the first layer is lower than the refractive index of the second layer, and a difference between the refractive index of the first layer and the refractive index of the second layer is at least 0.1 and no greater than 0.8,
the first layer includes metal fluoride and has thickness of at least 75 nm and no greater than 120 nm,
a thickness of the functional layer is different below each of the red organic light-emitting layer portion, the green organic light-emitting layer portion, and the blue organic light-emitting layer portion, the thickness being set such that a resonator structure within each of the red organic light-emitting element, the green organic light-emitting element, and the blue organic light-emitting element is either a 1st cavity structure or a 2nd cavity structure,
a maximum thickness of the functional layer is no greater than 70 nm, and
the thickness of the first layer, the difference between the refractive index of the first layer and the refractive index of the second electrode, and the difference between the refractive index of the first layer and the refractive index of the second layer produce interference between light travelling along a first optical pathway and light travelling along a second optical pathway, the light travelling along the first optical pathway not being reflected at an interface between the second electrode and the first layer, the light travelling along the second optical pathway being reflected at the interface between the second electrode and the first layer and reflected by the first electrode.

2. The organic light-emitting panel of claim 1, wherein the first layer has the thickness of at least 75 nm and no greater than 110 nm.

3. The organic light-emitting panel of claim 1, wherein the first layer has the thickness of at least 75 nm and no greater than 100 nm.

4. The organic light-emitting panel of claim 1, wherein the second electrode has thickness of at least 30 nm and no greater than 40 nm, and
the second layer has thickness of at least 100 nm and no greater than 680 nm.

5. The organic light-emitting panel of claim 1, wherein the second electrode includes ITO or IZO, and
the second layer includes silicon nitride or silicon oxynitride.

6. The organic light-emitting panel of claim 1, further comprising
a color filter located above the second layer.

7. The organic light-emitting panel of claim 1, wherein regions of the first layer corresponding to the red organic light-emitting layer portion, the green organic light-emitting layer portion, and the blue organic light-emitting layer portion are equal in terms of thickness.

8. The organic light-emitting panel of claim 1, further comprising:
color filters located on the substrate.

9. An organic light-emitting panel comprising:
a first electrode that is light-reflecting;
a functional layer having a single layer or multi-layer structure, located on the first electrode;
an organic light-emitting layer located on the functional layer, the organic light-emitting layer including a red organic light-emitting layer portion defining a red organic light-emitting element, a green organic light-emitting layer portion defining a green organic light-emitting element, and a blue organic light-emitting layer portion defining a blue organic light-emitting element;
a second electrode that is light-transmitting, located above the organic light-emitting layer;
a first layer located on the second electrode;
a second layer located on the first layer;
a sealing layer located on the second layer, the sealing layer composed of aluminum oxide;
a resin sealing layer located on the sealing layer; and
a substrate located on the resin sealing layer, the substrate being adhered to the sealing layer via the resin sealing layer, wherein
a refractive index of the second electrode is at least 2.0 and no greater than 2.4,
a refractive index of the first layer is at least 1.3 and no greater than 1.6,
a refractive index of the second layer is at least 1.7 and no greater than 2.1,
the refractive index of the first layer is lower than the refractive index of the second electrode, and a difference between the refractive index of the first layer and the refractive index of the second electrode is at least 0.4 and no greater than 1.1, the refractive index of the first layer is lower than the refractive index of the second layer, and a difference between the refractive index of the first layer and the refractive index of the second layer is at least 0.1 and no greater than 0.8, the first layer includes metal fluoride and an optical path length in a thickness direction of the first layer is at least 99.8 nm and no greater than 160 nm, a thickness of the functional layer is different below each of the red organic light-emitting layer portion, the green organic light-emitting layer portion, and the blue organic light-emitting layer portion, the thickness being set such that a resonator structure within each of the red organic light-emitting element, the green organic light-emitting element, and the blue organic light-emitting element is either a 1st cavity structure or a 2nd cavity structure, optical path lengths in a thickness direction of the functional layer are no greater than 161 nm, and a thickness of the first layer, the difference between the refractive index of the first layer and the refractive index of the second electrode, and the difference between the refractive index of the first layer and the refractive index of the second layer produce interference between light travelling along a first optical pathway and light travelling along a second optical pathway, the light travelling along the first optical pathway not being reflected at an interface between the second electrode and the first layer, the light travelling along the second optical pathway being reflected at the interface between the second electrode and the first layer and reflected by the first electrode.

10. The organic light-emitting panel of claim 9, wherein an optical path length in a thickness direction of the second electrode is at least 60 nm and no greater than 96 nm, and an optical path length in a thickness direction of the second layer is at least 170 nm and no greater than 1428 nm.

11. The organic light-emitting panel of claim 9, wherein the second electrode includes ITO or IZO, and the second layer includes silicon nitride or silicon oxynitride.

12. The organic light-emitting panel of claim 9, further comprising a color filter located above the second layer.

13. The organic light-emitting panel of claim 9, wherein regions of the first layer corresponding to the red organic light-emitting layer portion, the green organic light-emitting layer portion, and the blue organic light-emitting layer portion are equal in terms of thickness.

14. A method for producing an organic light-emitting panel, the method comprising:

forming a first electrode that is light-reflecting;

layering a functional layer having a single layer or multi-layer structure on the first electrode;

layering an organic light-emitting layer on the functional layer, the organic light-emitting layer including a red organic light-emitting layer portion defining a red organic light-emitting element, a green organic light-emitting layer portion defining a green organic light-emitting element, and a blue organic light-emitting layer portion defining a blue organic light-emitting element;

forming a second electrode that is light-transmitting above the organic light-emitting layer;

layering a first layer on the second electrode;

layering a second layer on the first layer;

layering a sealing layer on the second layer, the sealing layer composed of aluminum oxide;

layering a resin sealing layer on the sealing layer; and layering a substrate on the resin sealing layer to adhere the substrate to the sealing layer via the resin sealing layer, wherein a refractive index of the second electrode is at least 2.0 and no greater than 2.4, a refractive index of the first layer is at least 1.3 and no greater than 1.6, a refractive index of the second layer is at least 1.7 and no greater than 2.1, the refractive index of the first layer is lower than the refractive index of the second electrode, and a difference between the refractive index of the first layer and the refractive index of the second electrode is at least 0.4 and no greater than 1.1, the refractive index of the first layer is lower than the refractive index of the second layer, and a difference between the refractive index of the first layer and the refractive index of the second layer is at least 0.1 and no greater than 0.8, the first layer includes metal fluoride and has thickness of at least 75 nm and no greater than 120 nm, a thickness of the functional layer is different below each of the red organic light-emitting layer portion, the green organic light-emitting layer portion, and the blue organic light-emitting layer portion, the thickness being set such that a resonator structure within each of the red organic light-emitting element, the green organic light-emitting element, and the blue organic light-emitting element is either a 1st cavity structure or a 2nd cavity structure, a maximum thickness of the functional layer is no greater than 70 nm, and the thickness of the first layer, the difference between the refractive index of the first layer and the refractive index of the second electrode, and the difference between the refractive index of the first layer and the refractive index of the second layer produce interference between light travelling along a first optical pathway and light travelling along a second optical pathway, the light travelling along the first optical pathway not being reflected at an interface between the second electrode and the first layer, the light travelling along the second optical pathway being reflected at the interface between the second electrode and the first layer and reflected by the first electrode.

15. A method for producing an organic light-emitting panel, the method comprising:

forming a first electrode that is light-reflecting;

layering a functional layer having a single layer or multi-layer structure on the first electrode;

layering an organic light-emitting layer on the functional layer, the organic light-emitting layer including a red organic light-emitting layer portion defining a red organic light-emitting element, a green organic light-emitting layer portion defining a green organic light-emitting element, and a blue organic light-emitting layer portion defining a blue organic light-emitting element;

forming a second electrode that is light-transmitting above the organic light-emitting layer;

layering a first layer on the second electrode;

layering a second layer on the first layer; and layering a sealing layer on the second layer, the sealing layer composed of aluminum oxide;
layering a resin sealing layer on the sealing layer; and
layering a substrate on the resin sealing layer to adhere the substrate to the sealing layer via the resin sealing layer, wherein
a refractive index of the second electrode is at least 2.0 and no greater than 2.4,
a refractive index of the first layer is at least 1.3 and no greater than 1.6,
a refractive index of the second layer is at least 1.7 and no greater than 2.1,
the refractive index of the first layer is lower than the refractive index of the second electrode, and a difference between the refractive index of the first layer and the refractive index of the second electrode is at least 0.4 and no greater than 1.1,
the refractive index of the first layer is lower than the refractive index of the second layer, and a difference between the refractive index of the first layer and the refractive index of the second layer is at least 0.1 and no greater than 0.8,
the first layer includes metal fluoride and an optical path length in a thickness direction of the first layer is at least 99.8 nm and no greater than 160 nm,
a thickness of the functional layer is different below each of the red organic light-emitting layer portion, the green organic light-emitting layer portion, and the blue organic light-emitting layer portion, the thickness being set such that a resonator structure within each of the red organic light-emitting element, the green organic light-emitting element, and the blue organic light-emitting element is either a 1st cavity structure or a 2nd cavity structure,
optical path lengths in a thickness direction of the functional layer are no greater than 161 nm, and
a thickness of the first layer, the difference between the refractive index of the first layer and the refractive index of the second electrode, and the difference between the refractive index of the first layer and the refractive index of the second layer produce interference between light travelling along a first optical pathway and light travelling along a second optical pathway, the light travelling along the first optical pathway not being reflected at an interface between the second electrode and the first layer, the light travelling along the second optical pathway being reflected at the interface between the second electrode and the first layer and reflected by the first electrode.

* * * * *